(12) United States Patent
Hsu et al.

(10) Patent No.: US 12,131,944 B2
(45) Date of Patent: Oct. 29, 2024

(54) SLURRY COMPOSITION, SEMICONDUCTOR STRUCTURE AND METHOD FOR FORMING THE SAME

(71) Applicant: TAIWAN SEMICONDUCTOR MANUFACTURING COMPANY LTD., Hsinchu (TW)

(72) Inventors: Chun-Wei Hsu, Hsinchu (TW); Chih-Chieh Chang, Hsinchu County (TW); Yi-Sheng Lin, Taichung (TW); Jian-Ci Lin, Hsinchu (TW); Jeng-Chi Lin, Hsinchu (TW); Ting-Hsun Chang, Kaohsiung (TW); Liang-Guang Chen, Hsinchu (TW); Ji Cui, Bolingbrook, IL (US); Kei-Wei Chen, Tainan (TW); Chi-Jen Liu, Taipei (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 553 days.

(21) Appl. No.: 17/460,929

(22) Filed: Aug. 30, 2021

(65) Prior Publication Data
US 2023/0064918 A1 Mar. 2, 2023

(51) Int. Cl.
*H01L 21/768* (2006.01)
*C09G 1/02* (2006.01)
*H01L 23/522* (2006.01)

(52) U.S. Cl.
CPC ............ *H01L 21/7684* (2013.01); *C09G 1/02* (2013.01); *H01L 21/76877* (2013.01); *H01L 23/5226* (2013.01)

(58) Field of Classification Search
CPC ........... H01L 21/7684; H01L 21/76843; H01L 21/76877; C09G 1/02
See application file for complete search history.

(56) References Cited

U.S. PATENT DOCUMENTS

2020/0090983 A1* 3/2020 Lee ................... H01L 21/76877
2021/0371702 A1* 12/2021 Cui ..................... H01L 21/3212
2022/0017780 A1* 1/2022 Cui .......................... H01L 23/50

OTHER PUBLICATIONS

Lim et al., "Effects of oxidants on the removal of tungsten in CMP process" Wear, vol. 257, Issues 9-10, Nov. 2004, pp. 863-868, (https://doi.org/10.1016/j.wear.2004.02.007).

* cited by examiner

*Primary Examiner* — Jaehwan Oh
*Assistant Examiner* — John M Parker
(74) *Attorney, Agent, or Firm* — WPAT LAW; Anthony King

(57) ABSTRACT

A slurry composition, a semiconductor structure and a method for forming a semiconductor structure are provided. The slurry composition includes a slurry and a precipitant dispensed in the slurry. The semiconductor structure comprises a blocking layer including at least one element of the precipitant. The method includes using the slurry composition with the precipitant to polish a conductive layer and causing the precipitant to flow into the gap.

20 Claims, 19 Drawing Sheets

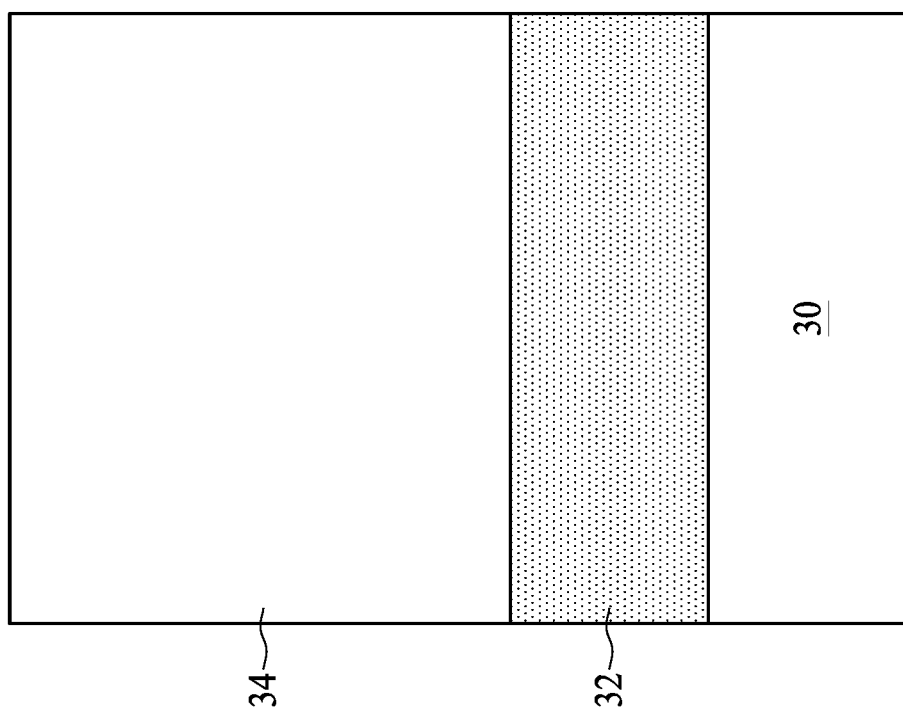

SLURRY COMPOSITION, SEMICONDUCTOR STRUCTURE AND METHOD FOR FORMING THE SAME

BACKGROUND

Polishing such as chemical mechanical polishing (CMP) has been widely used in semiconductor integrated circuit (IC) fabrication. The slurry for polishing one particular material in an integrated circuit, however, may result in corrosion of another material in the integrated circuit.

BRIEF DESCRIPTION OF THE DRAWINGS

Aspects of the embodiments of the present disclosure are best understood from the following detailed description when read with the accompanying figures. It is noted that, in accordance with the standard practice in the industry, various structures are not drawn to scale. In fact, the dimensions of the various structures may be arbitrarily increased or reduced for clarity of discussion.

FIG. 2A, FIG. 2B and FIG. 2C are schematic diagrams illustrating a method for manufacturing a semiconductor structure according to various aspects of a comparative embodiment of the present disclosure.

DETAILED DESCRIPTION

Figure 1:
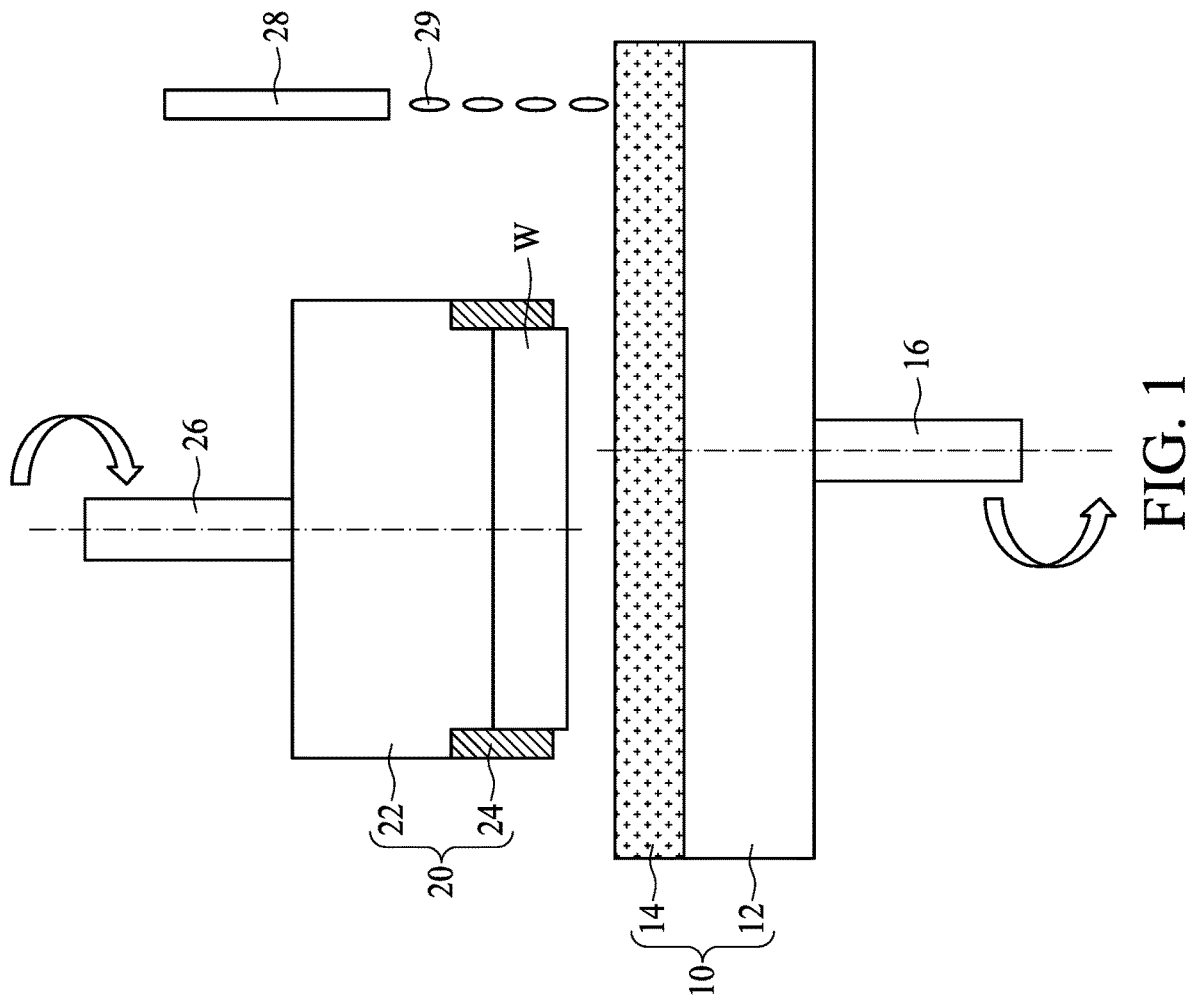
FIG. 1 is a schematic diagram of a CMP apparatus according to some embodiments of the present disclosure.

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "upper," "on," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the terms such as "first," "second" and "third" describe various elements, components, regions, layers and/or sections, these elements, components, regions, layers and/or sections should not be limited by these terms. These terms may be only used to distinguish one element, component, region, layer or section from another. The terms such as "first," "second" and "third" when used herein do not imply a sequence or order unless clearly indicated by the context.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation.

Chemical mechanical polishing (CMP) is an operation of smoothing surfaces with the combination of chemical and mechanical forces. The CMP can be treated as a hybrid of chemical etching and abrasive polishing. The CMP operation uses a slurry including abrasives and corrosive chemicals in conjunction with a polishing pad and a retaining ring. The polishing pad and a wafer are pressed together by a polishing head and held in place by the retaining ring. The polishing head may be rotated about different axes of rotation, which removes materials and tends to smooth any irregular topography, making the wafer flat or planar. This flat or planar surface may facilitate formation of successive components.

FIG. 1 is a schematic diagram of a CMP apparatus 1 according to some embodiments of the present disclosure. As depicted in FIG. 1, the CMP apparatus 1 includes a polishing wheel assembly 10 and a wafer carrier assembly 20. The polishing wheel assembly 10 includes a polishing platen 12 and a polishing pad 14. The polishing platen 12 is coupled to a spindle (or a shaft) 16. The spindle 16 is able to be rotated by any suitable motor or driving mechanism. The polishing pad 14 is attached on the polishing platen 12, and thus is able to be rotated along with the polishing platen 12. The wafer carrier assembly 20 includes a wafer carrier 22 configured to hold or to grip a wafer W. The wafer carrier 22 is coupled to another spindle (or a shaft) 26. The spindle 26 is able to be rotated by any suitable motor or driving mechanism. The rotation of the wafer carrier 22 and the rotation of the polishing platen 12 are independently controlled. The rotational direction of the wafer carrier 22 or the rotational direction of the polishing platen 12 can be clockwise or counterclockwise. The wafer carrier 22 further includes a retainer ring 24 for retaining the wafer W to be polished. The retainer ring 24 is able to prevent the wafer W from sliding out from under the wafer carrier 22 as the wafer carrier 22 moves. In some embodiments, the retainer ring 24 has a ring-shaped structure.

During a CMP operation, the polishing pad 14 coupled to the polishing platen 12 and the wafer W retained by the retainer ring 24 are both rotated at appropriate rates. Meanwhile, the spindle 26 supports a force, which is exerted against the wafer carrier 22, and thus is exerted against the wafer W, thereby causing the wafer W to contact the polishing pad 14. Thus, the wafer W or the overlying film (not shown) over the wafer W is polished. During the CMP operation, a slurry introduction device 28 introduces a slurry 29 on the polishing pad 14. The composition of slurry 29 may be selected depending on the material of the wafer W or the overlying film to be polished. For example, the types of the slurry 29 may be roughly classified into a slurry for oxide, a slurry for metal, and a slurry for poly-silicon according to the type of object to be polished. The composition of the slurry 29 may include abrasives to provide mechanical polishing force, and chemicals such as oxidizer to react with the material to be polished.

Figure 2B:
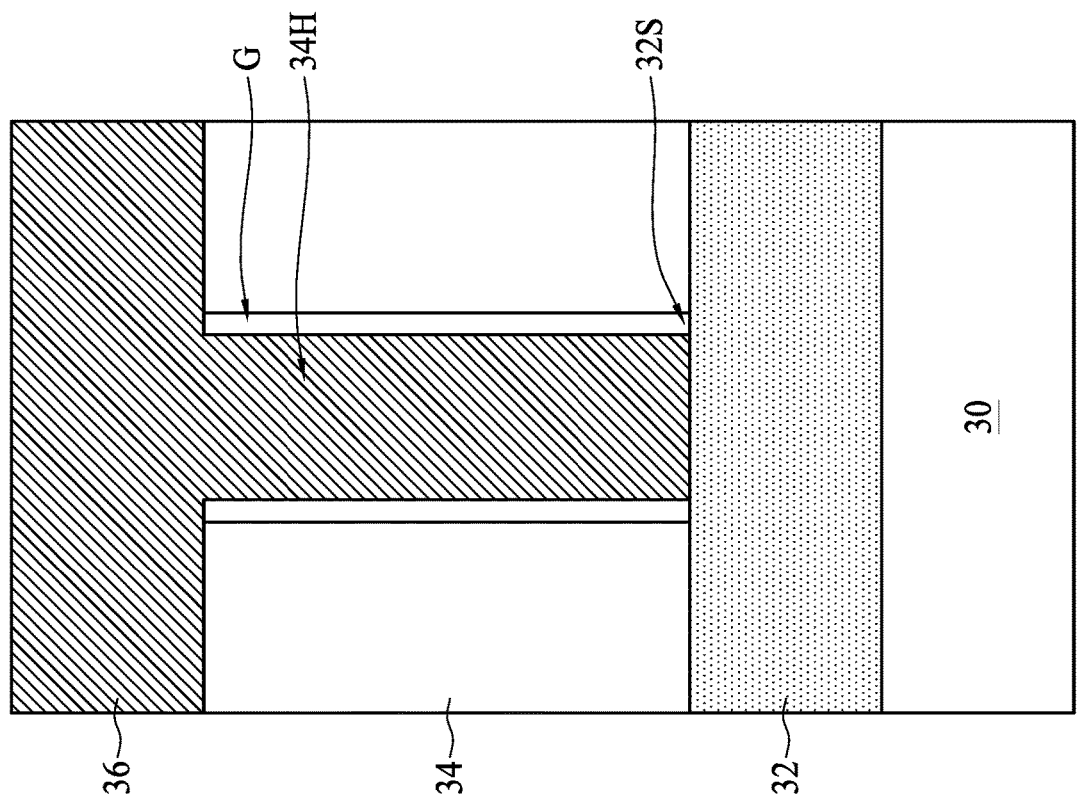
Figure 2C:
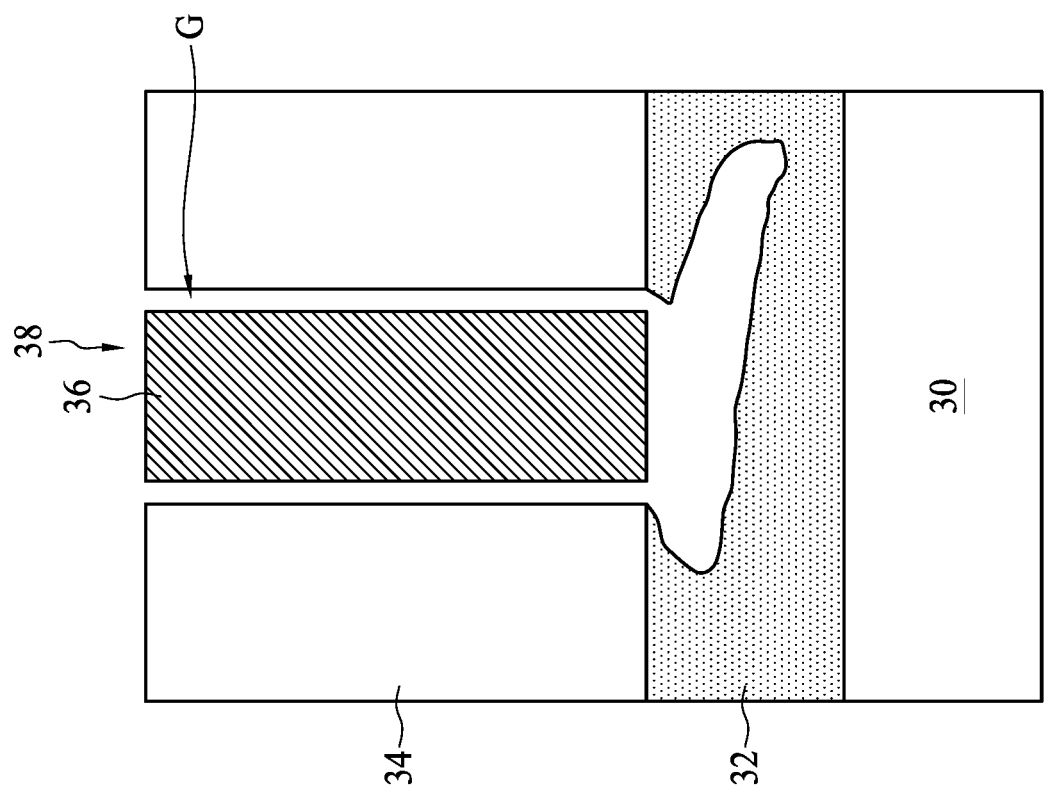

FIG. 2A, FIG. 2B and FIG. 2C are schematic diagrams illustrating a method for manufacturing a semiconductor structure according to various aspects of a comparative embodiment of the present disclosure. As shown in FIG. 2A, a substrate 30 such as a semiconductor substrate is provided. A first conductive layer 32 is formed on the substrate 30. The material of the first conductive layer 32 may include, but is not limited to, metal such as cobalt (Co), copper (Cu) or an alloy thereof. A dielectric layer 34 is formed on the substrate 30, and covers the first conductive layer 32. The material of the dielectric layer 34 may include, but is not limited to, inorganic dielectric material such as silicon oxide, silicon nitride or silicon oxynitride, organic dielectric material or a combination thereof.

As shown in FIG. 2B, the dielectric layer 34 is patterned for example, by etching, to form a hole 34H partially exposing the first conductive layer 32. A second conductive layer 36 is formed on the dielectric layer 34 and in the hole 34H to electrically connect to the exposed portion of the first conductive layer 32. The material of the second conductive layer 36 may be different from or the same as the first conductive layer 32. By way of example, the material of the second conductive layer 36 may include, but is not limited to, metal such as tungsten (W) or an alloy thereof. In some embodiments, the interface between the dielectric layer 34 and the second conductive layer 36 may be porous, and thus forms a gap G between the dielectric layer 34 and the second conductive layer 36, and over the first conductive layer 32. For example, a tungsten-silicon oxide surface may be inherently porous, thereby automatically forming a gap G, which generates a liquid leakage path.

As shown in FIG. 2C, a CMP operation is performed to polish the second conductive layer 36 to form a conductive plug 38. Once portions of the second conductive layer 36 over the dielectric layer 34 are removed, the gap G is exposed. The slurry used to polish the second conductive layer 36 may fill the gap G and be in contact with the underlying first conductive layer 32 during the CMP operation. The slurry for polishing the second conductive layer 36 may be reactive with the first conductive layer 32, and may thus result in corrosion of the first conductive layer 32. As the substrate 30 is rotated during the CMP operation, fresh slurry may keep on dispensing around the second conductive layer 32 to replace old slurry and continuously corrodes the first conductive layer 32 through the gap G. Accordingly, the loss of the first conductive layer 32, represented by the empty portion shown in FIG. 2C between the corroded first conductive layer 32 and the second conductive layer 36, may be serious during the CMP operation, which may adversely affect electric performance and reliability of the conductive plug 38.

Figure 3:
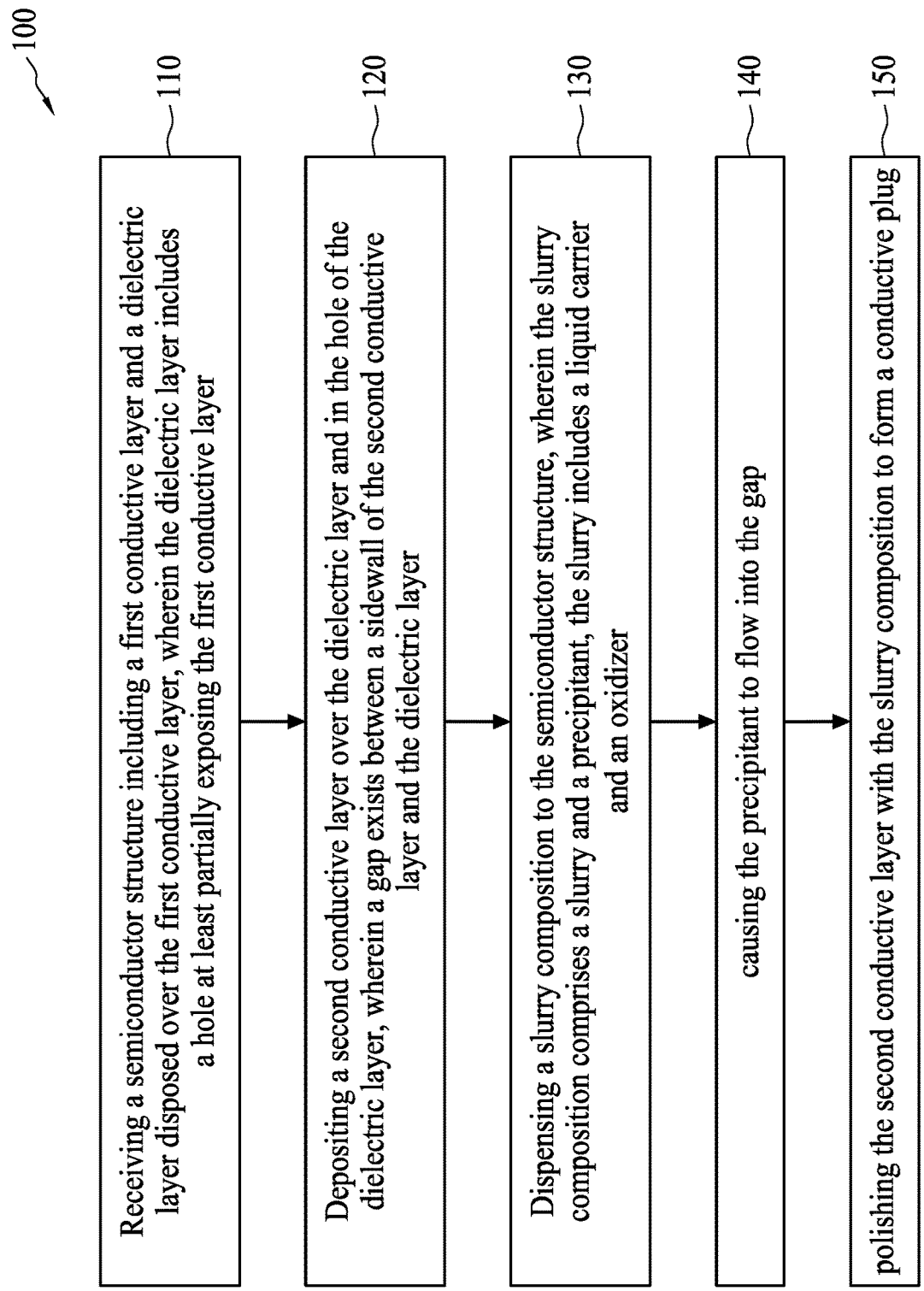
FIG. 3 is a flow chart illustrating a method for manufacturing a semiconductor structure according to various aspects of one or more embodiments of the present disclosure.

Referring to FIG. 3, a flow chart is shown to illustrate a method 100 for manufacturing a semiconductor structure according to various aspects of one or more embodiments of the present disclosure. The method 100 begins with operation 110 in which a semiconductor structure is provided. The semiconductor structure includes a first conductive layer and a dielectric layer disposed over the first conductive layer. The dielectric layer includes a hole at least partially exposing the first conductive layer. The method 100 proceeds with operation 120 in which a second conductive layer is deposited over the dielectric layer and in the hole of the dielectric layer, wherein a gap exists between a sidewall of the second conductive layer and the dielectric layer. The method 100 proceeds with operation 130 in which a slurry composition is dispensed to the semiconductor structure, wherein the slurry composition comprises a slurry and a precipitant. The slurry includes a liquid carrier and an oxidizer. The method 100 proceeds with operation 140 in which the precipitant is caused to flow into the gap. The method 100 proceeds with operation 150 in which the second conductive layer is polished with the slurry composition to form a conductive plug. Details of the slurry composition of the present disclosure, the semiconductor structure and the method for forming the same will be discussed in FIG. 4A to FIG. 4C.

The method 100 is merely an example, and is not intended to limit the present disclosure beyond what is explicitly recited in the claims. Additional operations can be provided before, during, and after the method 100, and some operations described can be replaced, eliminated, or moved around for additional embodiments of the method.

Figure 4A:
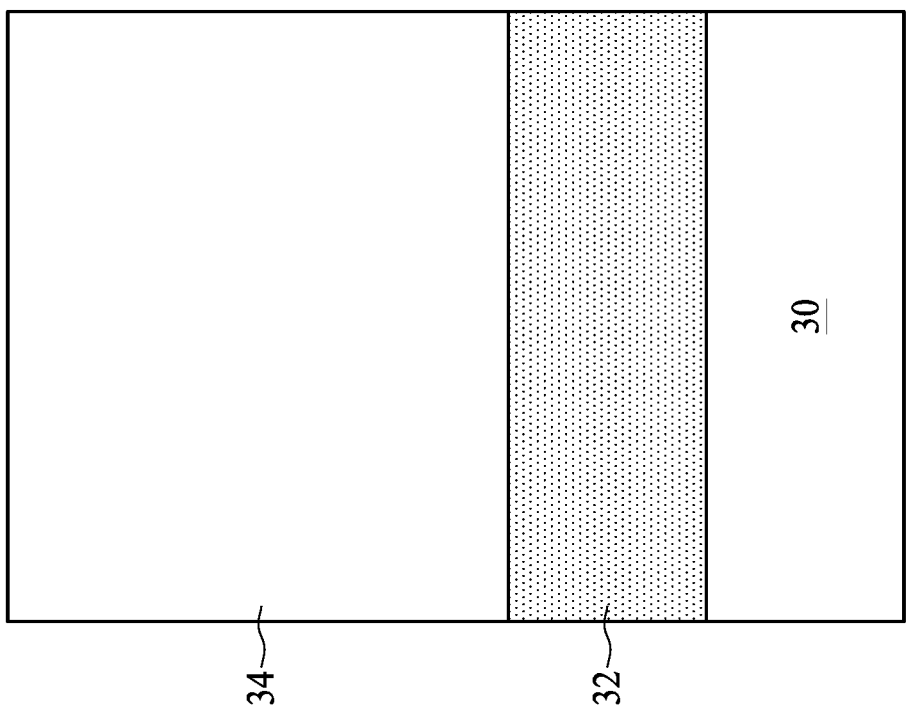
FIG. 4A, FIG. 4B and FIG. 4C are schematic diagrams illustrating cross-sectional views of intermediate stages of a method for manufacturing a semiconductor structure according to various aspects of some embodiments of the present disclosure.
Figure 4B:
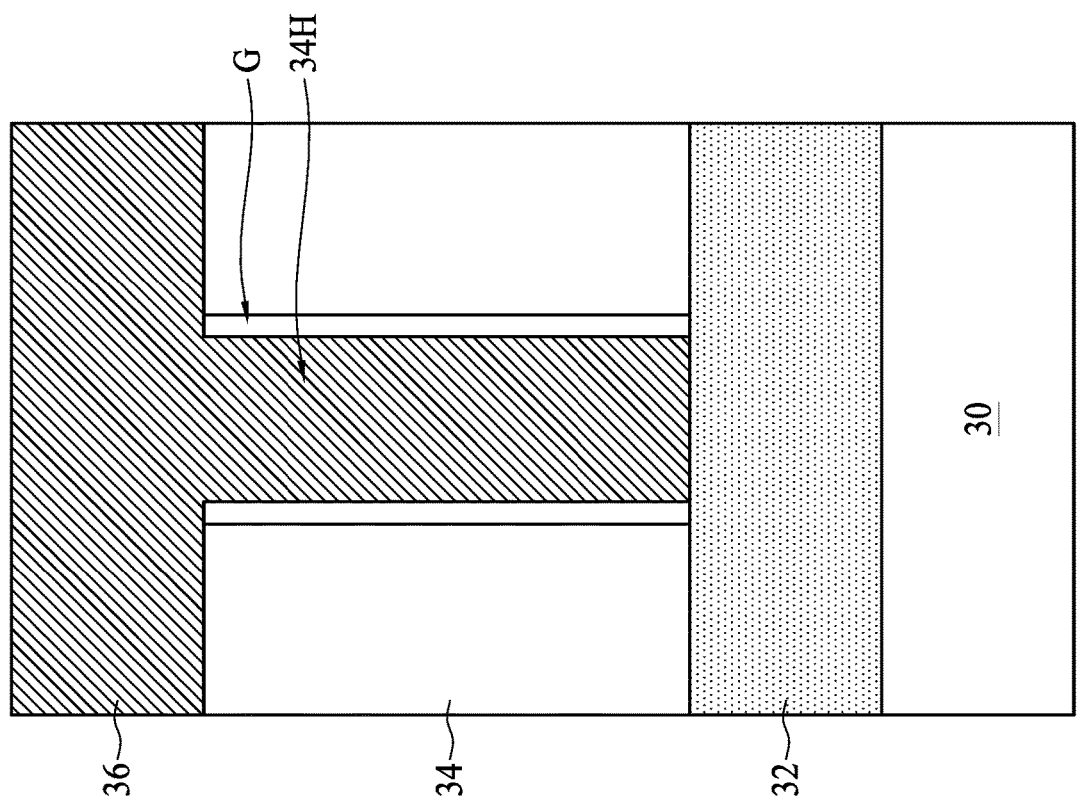
Figure 4C:
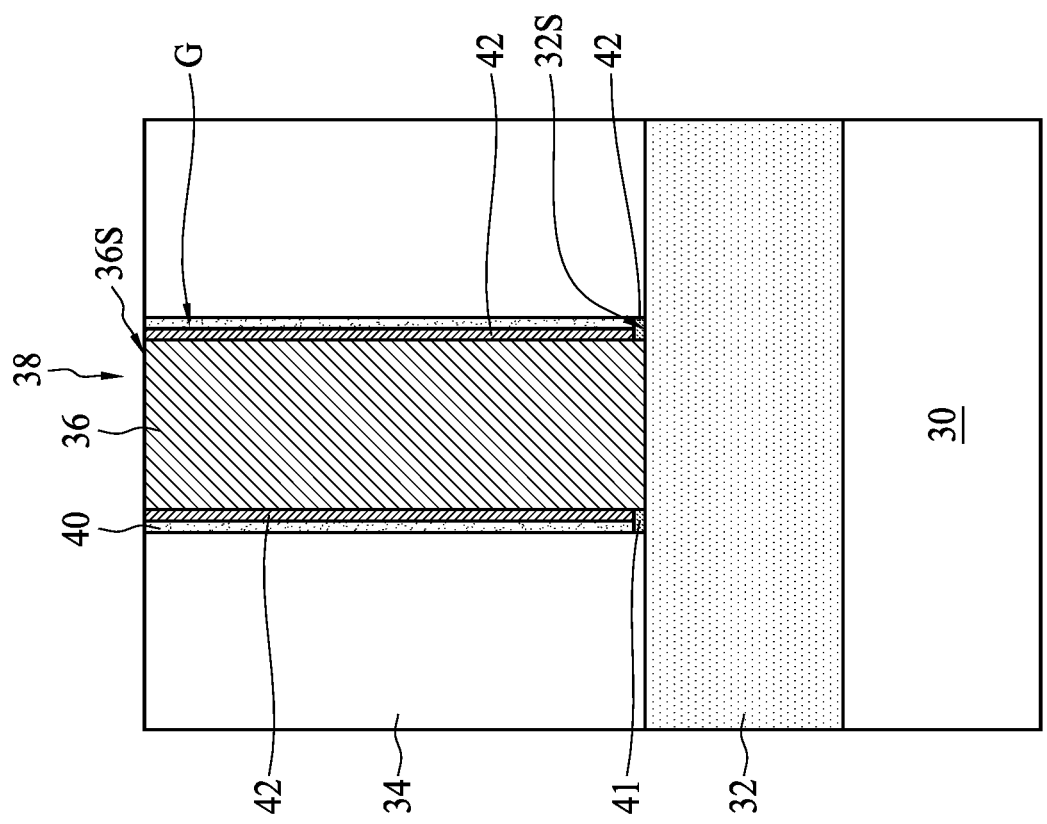

FIG. 4A, FIG. 4B and FIG. 4C are schematic diagrams illustrating cross-sectional views of intermediate stages of a method for manufacturing a semiconductor structure according to various aspects of some embodiments of the present disclosure. As shown in FIG. 4A, a substrate 30 such as a semiconductor substrate is provided. A first conductive layer 32 is formed on the substrate 30. The material of the first conductive layer 32 may include, but is not limited to, metal such as cobalt (Co) or an alloy thereof. A dielectric layer 34 is formed on the substrate 30, and covers the first conductive layer 32. The material of the dielectric layer 34 may include, but is not limited to, inorganic dielectric material such as silicon oxide, silicon nitride or silicon oxynitride, organic dielectric material or a combination thereof. In some embodiments, the dielectric layer 34 may include a tetraethylorthosilicate (TEOS) oxide layer formed by deposition using TEOS as a deposition precursor.

As shown in FIG. 4B, the dielectric layer 34 is patterned for example, by etching, to form a hole 34H partially exposing the first conductive layer 32. In some embodiments, the width or diameter of the hole 34H is, but not limited to, in a range from about 14 angstroms to about 20 angstroms. In some embodiments, the depth of the hole 34H is, but not limited to, in a range from about 10 angstroms to about 90 angstroms. The cross-sectional profile of the hole 34H may include a rectangular profile, a trapezoid shape, an inversed trapezoid shape or other geometrical shape. A second conductive layer 36 is formed on the dielectric layer 34 and in the hole 34H to electrically connect to the exposed first conductive layer 32. The material of the second conductive layer 36 may be different from or the same as the first conductive layer 32. By way of example, the material of the second conductive layer 36 may include, but is not limited to, metal such as tungsten (W) or an alloy thereof. In some embodiments, the interface between the dielectric layer 34 and the second conductive layer 36 may be porous, and thus forms a gap G between the dielectric layer 34 and the second conductive layer 36. For example, a tungsten-silicon oxide surface may be inherently porous, thereby forming a gap G automatically, which generates a liquid leakage path. In some embodiments, the width of the gap G is, but not limited to be, ranging from about 1 angstrom to about 10 angstroms.

As shown in FIG. 4C, a CMP operation is performed to polish the second conductive layer 36 to form a conductive plug 38. Once the second conductive layer 36 over the dielectric layer 34 is removed, the gap G is exposed. The slurry composition used to polish the second conductive layer 36 may fill in the gap G.

The slurry composition of the present disclosure includes a slurry and a precipitant. In some embodiments, the precipitant may be dispersed in the slurry. In some embodiments, the precipitant may be used in combination with or successively with the slurry. In some embodiments, the precipitant may be incorporated into the slurry composition after the gap G is exposed. In some embodiments, the precipitant may be dispersed in the slurry as the CMP operation begins. The slurry may include at least one abrasive and at least one liquid carrier. The abrasives may be configured to provide mechanical polishing effect during the CMP operation. The abrasives may include inorganic particles such as silicon oxide particles, cerium oxide particles or the like. The liquid carrier may include water or other solvents.

In some embodiments, the slurry composition may further include a pH adjusting agent dispersed in the slurry to adjust the pH value thereof to accelerate oxidization of the second conductive layer 36 to be polished, to improve the stability of the slurry composition, or to improve the safety in handling and use. In some embodiments, it is desirable to formulate the slurry composition to be at acidic pH of less than about 7.0 for polishing tungsten or alloy thereof. In some embodiments, the pH value of the slurry composition ranges from about 0.5 to about 6.5, about 1.0 to about 5.0, about 1.5 to about 4.0, or about 2.0 to about 3.0, but is not limited to the above-mentioned values. Maintaining the pH value of the slurry composition facilitates control of the CMP operation and enhances removal rate. The pH value of the slurry composition can be adjusted with chemicals such as nitric acid, hydrochloric acid and sulfuric acid to decrease pH.

In some embodiments, it is desirable to formulate the slurry composition to be at basic pH of greater than about 7.0 for polishing cobalt or alloy thereof. In some embodiments, the pH value of the slurry composition ranges from about 7.5 to about 13.5, about 8.0 to about 13.0, about 8.5 to about 12.0, or about 9.5 to about 10.5, but is not limited to the above-mentioned values. Maintaining the pH value of the slurry composition facilitates control of the CMP operation and enhances removal rate. The pH value of the slurry composition can be adjusted with chemicals such as potassium hydroxide and ammonium hydroxide to increase pH.

In some embodiments, the slurry composition may further include an oxidizer dispersed in the slurry. The oxidizer may be configured to oxidize the second conductive layer 36. The oxidized second conductive layer 36 is softened, and is therefore easily removed by mechanical polishing force. The oxidizer may also oxidize the first conductive layer 32 as the slurry enters the gap G, and thus resulting in corrosion of the first conductive layer 32. The oxidizer may include, but is not limited to, a peroxide, a halogenoxy acid, a salt of halogenoxy acid, a persulfate, a perborate, a periodate or mixtures thereof. In some embodiments, the slurry composition may further include a corrosion inhibitor to inhibit corrosion of the second conductive layer 36 during the CMP operation.

In some embodiments, the first conductive layer 32 is oxidized by the oxidizer or the liquid carrier of the slurry to form a first oxidized film during the CMP operation. In some embodiments, the first oxidized film is formed on the exposed surface 32S of the first conductive layer 32 facing the gap G. In some embodiments, the precipitant in the slurry composition is configured to convert the first oxidized film into a first precipitate. The first precipitate may be referred to as a first blocking layer 41. In some embodiments, the first blocking layer 41 is formed on the exposed surface 32S of the first conductive layer 32 in the gap G. In some embodiments, the first blocking layer 41 entirely covers the exposed surface 32S of the first conductive layer 32 in the gap G. In some embodiments, the first blocking layer 41 blocks the exposed surface 32S of the first conductive layer 32 from the oxidizer or the liquid carrier of the slurry. The precipitant may rapidly convert the first oxidized film into the first blocking layer 41 in the gap G on the exposed surface 32S of the first conductive layer 32, so as to protect and prevent the first conductive layer 32 from corrosion loss through the gap G during polishing the second conductive layer 36. Thus, the first conductive layer 32 around the gap G will not be over-etched by the slurry.

In some embodiments, the precipitant is such selected that the precipitant is able to flow into the gap G to react with the first oxidized film. In some embodiments, the precipitant is such selected that the CMP operation can be functionally operated and the precipitant can specifically react with the first oxidized film to form the first blocking layer 41 on the first conductive layer 32. The first blocking layer can block the exposed surface 32S of the first conductive layer 32 in the gap G and prevent the underlying first conductive layer 32 from corrosion. The first blocking layer 41 is used to block the first conductive layer 32 from being exposed to fresh slurry during the CMP operation. Accordingly, corrosion of the underlying first conductive layer 32 can be alleviated or avoided.

In some embodiments, the precipitant may be a salt consisting of an ionic assembly of cations (positively charged ions) and anions (negatively charged ions). The precipitant may be composed of related numbers of cations and anions. In some embodiments, the component ions of the precipitant may be, but is not limited to, monatomic, such as calcium ($Ca^{2+}$), magnesium ($Mg^{2+}$) and phosphide ($P^{3-}$), or polyatomic, such as phosphate ($PO_4^{3-}$) and nitrate ($NO_3^-$). In some embodiments, the precipitant may be soluble in the liquid carrier of the slurry. The precipitant may dissociate in the liquid carrier into cationic and anionic components (i.e., cations and anions).

In some embodiments, the precipitant may include compounds having at least one cation or at least one anion having an ionic radius less than a half-width of the gap G. The width of the gap G may be considered as the full-width of the opening of the gap G from a cross-sectional perspective. The half-width of the gap G may be considered as the half-width of the opening of the gap G from a cross-sectional perspective. In some embodiments, the precipitant may include compounds having at least one cation or at least one anion having an ionic radius less than a half-width (or equivalently one-half of the width) of the gap G. Accordingly, the cation and/or the anion of precipitant may be able to flow into the gap G freely to react with the first oxidized film or the second oxidized film.

In some embodiments, an ionic radius of a cation or an anion of the precipitant is less than about 5 angstroms. In some embodiments, an ionic radius of a cation or an anion of the precipitant the precipitant is less than about 4 angstroms. In some embodiments, an ionic radius of a cation or an anion of the precipitant the precipitant is less than about 3 angstroms. In some embodiments, an ionic radius of a cation or an anion of the precipitant the precipitant is less than about 2 angstroms. In some embodiments, an ionic radius of a cation or an anion of the precipitant the precipitant is less than about 1 angstrom. In some embodiments, an ionic radius of a cation or an anion of the precipitant the precipitant is in a range between about 1 angstrom to about 2 angstroms.

In some embodiments, the cation of the precipitant may include monatomic cations. In some embodiments, the cation of the precipitant may include, but is not limited to, alkaline-earth cations. In some embodiments, the precipitant may include, but is not limited to, salts of Group II (alkaline-earth metal). In some embodiments, the precipitant may include, but is not limited to, salts of beryllium ($Be^{2+}$), salts of magnesium ($Mg^{2+}$), salts of calcium ($Ca^{2+}$), salts of strontium ($Sr^{2+}$), salts of barium ($Ba^{2+}$) or a mixture thereof.

In some embodiments, the anion of the precipitant may include monatomic anions, polyatomic anions, or a mixture thereof. In some embodiments, the monatomic anions of the precipitant may include, but is not limited to, phosphide ($P^{3-}$). In some embodiments, the polyatomic anions of the precipitant may include, but is not limited to, nitrite ($NO_2^-$), nitrate ($NO_3^-$), phosphate ($PO_4^{3-}$), hydrogen phosphate ($HPO_4^{2-}$), dihydrogen phosphate ($H_2PO_4^-$) or a mixture thereof. In some embodiments, the precipitant may include, but is not limited to, nitrate salts, phosphate salts or a mixture thereof.

In some embodiments, the element of precipitant includes at least one alkaline-earth metal, at least one nitrogen, and/or at least one phosphorus. In some embodiments, the precipitant includes a compound having at least one alkaline-earth metal atom, a compound having at least one nitrogen atom, or a compound having at least one phosphorus atom. In some embodiments, the precipitant may include, but is not limited to, magnesium nitrate, calcium nitrate, magnesium phosphate, calcium phosphate or a mixture thereof.

In some embodiments, the first blocking layer includes at least one metallic element of the first conductive layer 32. In some embodiments, the first blocking layer further includes at least one element of the precipitant. In some embodiments, the first blocking layer 41 includes at least one cation or at least one anion of the precipitant. In some embodiments, the first blocking layer 41 may be a complex including at least one metallic element of the first conductive layer 32 and at least one element of the precipitant. In some embodiments, the first blocking layer 41 may be a complex including at least one metallic element of the first conductive layer 32, at least one oxygen atom and at least one element of the precipitant. In some embodiments, when the first oxidized film reacts with the precipitant, such as calcium nitrate, the first blocking layer 41 (i.e., the first precipitate) of $Ca_xCo_yO_z$ is formed. In some embodiments, a chemical formula of the first blocking layer 41 includes $Ca_3Co_2O_6$, $Ca_2Co_2O_5$ or a mixture thereof. In some embodiments, the first blocking layer 41 is insoluble in the liquid carrier of the slurry. Thus, the first blocking layer 41 precipitates as it is formed. The first blocking layer 41 will block the liquid leakage path to the first conductive layer 32 during the CMP operation. The first conductive layer 32 in the gap G is isolated from the slurry composition and thus will not suffer from material loss due to the slurry.

In some embodiments, the sidewall of the second conductive layer 36 facing the gap G is oxidized by the oxidizer or the liquid carrier of the slurry to form a second oxidized film during the CMP operation. For example, the second oxidized film may be, but is not limited thereto, $WO_3$. In some embodiments, the second oxidized film is formed on the exposed sidewall of the second conductive layer 36 facing the gap G. In some embodiments, the precipitant is also configured to convert the second oxidized film into a second precipitate. The second precipitate may be referred to as a second blocking layer 42. In some embodiments, the second blocking layer 42 is formed on the exposed sidewall of the second conductive layer 36 in the gap G. In some embodiments, the second blocking layer 42 entirely covers the exposed sidewall of the second conductive layer 36 in the gap G. In some embodiments, the second blocking layer 42 blocks the exposed sidewall of the second conductive layer 36 in the gap G from the oxidizer or the liquid carrier of the slurry. The precipitant may rapidly convert the second oxidized film into the second blocking layer 42 in the gap G on the exposed sidewall of the second conductive layer 36 in the gap G, so as to protect and prevent the second conductive layer 36 in the gap G from corrosion loss through the gap G during polishing the second conductive layer 36. Thus, the second conductive layer 36 in the gap G will not be over-etched by the slurry.

In some embodiments, the precipitant is such selected that the precipitant is able to flow into the gap G to react with the second oxidized film. In some embodiments, the precipitant is such selected that the CMP operation can be functionally operated and the precipitant can specifically react with the second oxidized film to form the second blocking layer 42 on the second conductive layer 36. The second blocking layer 42 may be formed on the first blocking layer 41. The second blocking layer 42 can block the exposed sidewall of the second conductive layer 36 in the gap G and prevent the blocked portions of the second conductive layer 36 from corrosion. The second blocking layer 42 is used to block the second conductive layer 36 in the gap G from being exposed to fresh slurry during the CMP operation. Accordingly, corrosion of the second conductive layer 36 in the gap G can be alleviated or avoided.

In some embodiments, the second blocking layer 42 includes at least one metallic element of the second conductive layer 36. In some embodiments, the second blocking layer 42 further includes at least one element of the precipitant. In some embodiments, the second blocking layer 42 includes at least one cation or at least one anion of the precipitant. In some embodiments, the second blocking layer 42 may be a complex including at least one metallic element of the second conductive layer 36 and at least one element of the precipitant. In some embodiments, the second blocking layer 42 may be a complex including at least one metallic element of the second conductive layer 36, at least one oxygen atom and at least one element of the precipitant. In some embodiments, when the second oxidized film reacts with the precipitant, such as calcium nitrate, the second blocking layer (i.e., the second precipitate) of $Ca_xW_yO_z$ is formed. In some embodiments, a chemical formula of the second blocking layer 42 is $CaWO_4$. In some embodiments, the second blocking layer 42 is insoluble in the liquid carrier of the slurry. Thus, the second blocking layer 42 precipitates as it is formed. The second blocking layer 42 will block the liquid leakage path to the second conductive layer 36 in the gap G during the CMP operation. The second conductive layer 36 in the gap G may be isolated from the slurry composition and thus will not suffer from loss due to the slurry.

In some embodiments, when the precipitant in the slurry composition renders the exposed surface 32S of the first conductive layer 32 and/or the exposed sidewall of the second conductive layer 36 in the gap G to be covered with the first blocking layer 41 and/or the second blocking layer 42, the slurry will be blocked from reacting with the first conductive layer 32 and/or the second conductive layer 36 in the gap G. Accordingly, the corrosion of the first conductive layer 32 and/or the second conductive layer 36 in the gap G is alleviated or avoided.

In some embodiments, referring to FIG. 4C, the exposed surface 36S (also referred to as the to-be-polished surface) of the second conductive layer 36 is oxidized by the oxidizer or the liquid carrier of the slurry to form a third oxidized film. In some embodiments, the precipitant also converts the third oxidized film into a third precipitate. The third precipitate may be referred to as a third blocking layer (not shown). The third blocking layer may be formed on the exposed surface 36S of the second conductive layer 36, i.e., on the to-be-polished surface of the second conductive layer 36. In some embodiments, the third blocking layer entirely covers the exposed surface 36S of the second conductive layer 36. In some embodiments, the third blocking layer blocks the exposed surface 36S of the second conductive layer 36 from the oxidizer or the liquid carrier of the slurry. The precipitant may rapidly convert the third oxidized film into the third blocking layer on the exposed surface 36S of the second conductive layer 36, so as to protect and prevent the second conductive layer 36 from corrosion loss during polishing the second conductive layer 36. Thus, the second conductive layer 36 will not be over-etched by the slurry.

In some embodiments, the precipitant is such selected that the CMP operation can be functionally operated and the precipitant can specifically react with the third oxidized film to form the third blocking layer on the second conductive layer 36. The third blocking layer can block the exposed surface 36S of the second conductive layer 36 and prevent the underlying second conductive layer 36 from corrosion. Accordingly, corrosion of the underlying second conductive layer 36 can be alleviated or avoided. In some embodiments, the third blocking layer may be removed through the mechanical polishing by the abrasive of the slurry or a cleaning operation after the CMP operation is completed.

The precipitant can be included in the slurry composition in any amount effective to form a blocking layer (e.g. the first blocking layer 41) on the exposed surface of a conductive layer (e.g. the first conductive layer 32) such as cobalt (Co), copper (Cu) or an alloy thereof, and/or effective to provide desired processing performance properties of the slurry composition when polishing a conductive layer (e.g. the second conductive layer 36) such as tungsten (W) or an alloy thereof, such properties including one or more of a desired tungsten removal rate, desired oxide (e.g., TEOS) removal rate, useful for low particle size growth, and useful for low defectivity as measured by scratching or residue. In some embodiments, the amount of the precipitant in the slurry composition is at least about 1000 ppm by weight. For example, the amount of the precipitant in the slurry composition is between about 1,000 ppm and about 10,000 ppm by weight.

In some embodiments, the slurry composition may further include at least one corrosion inhibitor. The corrosion inhibitor may be configured to inhibit corrosion of the second conductive layer 36 during the CMP operation. In some embodiments, the corrosion inhibitor may be a salt. In some embodiments, the corrosion inhibitor may be soluble in the liquid carrier of the slurry. The corrosion inhibitor may dissociate in the liquid carrier into cations and anions. In some embodiments, an ionic radius of a cation or an anion of the corrosion inhibitor is greater than the half-width of the gap G. In some embodiments, an ionic radius of a cation or an anion of the corrosion inhibitor is greater than an ionic radius of a cation or an anion of the precipitant. In some embodiments, the cation and/or the anion of corrosion inhibitor cannot flow into the gap G to react with the first oxidized film or the second oxidized film. By way of example, the corrosion inhibitor may include amino acid, such as glycine.

In some embodiments, liquid components such as the liquid carrier may be vaporized successively, and other components of the slurry composition including the abrasive, the pH adjusting agent, and the precipitant may remain in the gap G, forming a protecting layer 40. In some embodiments, the protecting layer 40 includes at least one abrasive, at least one pH adjusting agent, or a mixture thereof. In some embodiments, the protecting layer 40 is formed between a sidewall of the second conductive layer 36 and the dielectric layer 34. In some embodiments, the protecting layer 40 is formed over the first blocking layer 41 and adjacent to the second blocking layer 42. In some embodiments, the first blocking layer 41 may precipitate in the protecting layer 40 in the gap G. In some embodiments, the second blocking layer 42 may precipitate in the protecting layer 40 in the gap G. In some embodiments, the first blocking layer 41 and the second blocking layer 42 respectively have an arbitrary profile depending on different design requirements.

In some embodiments, the pH value of the slurry composition is adjusted depending on the material of the layer to be polished. In some embodiments, since the precipitant in the slurry composition renders the exposed surface 32S of the first conductive layer 32 and/or the exposed surface of the second conductive layer 36 in the gap G to be protected by the first blocking layer 41 and/or the second blocking layer 42, the pH value of the slurry composition can be varied depending on different design requirements. For example, it may be desirable to formulate a slurry composition without the precipitant at acidic pH of less than about 7.0 for polishing tungsten or alloy thereof. Since the precipitant in the slurry composition of the present disclosure renders the exposed surface of the second conductive layer 36 in the gap G to be protected, the slurry composition may be adjusted to be acidic pH of less than about 7.0, basic pH of greater than about 7.0, or neutral pH of about 7.0.

Figure 5A:
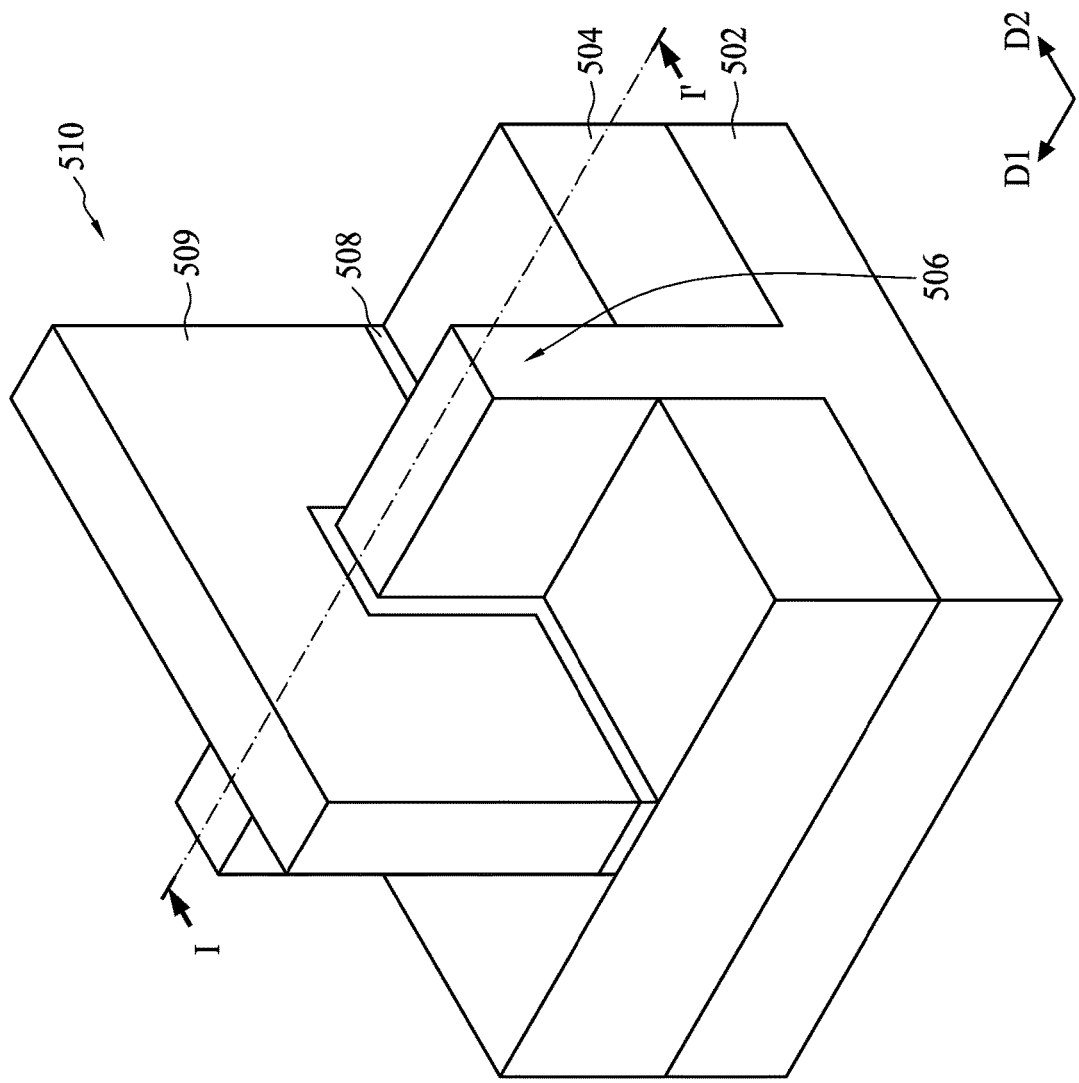
FIG. 5A to FIG. 5K are schematic diagrams illustrating a method for manufacturing a semiconductor structure according to some embodiments of the present disclosure.

FIG. 5A to FIG. 5K are schematic diagrams illustrating a method for manufacturing a semiconductor structure according to some embodiments of the present disclosure. FIG. 5A is a schematic perspective view of a semiconductor structure, and FIG. 5B, FIG. 5C, FIG. 5D, FIG. 5E, FIG. 5F, FIG. 5G, FIG. 5H, FIG. 5I, FIG. 5J and FIG. 5K are cross-sectional views illustrating the semiconductor structure at different fabrication stages taken along a line I-r of FIG. 5A. In some embodiments, the semiconductor structure may include a field effect transistor (FET), interconnections over the FET, and/or other semiconductor components. In some embodiments, the FET may include planar FET, FinFET, nanosheet FET, nanowire FET or the like. It should be noted that FIG. 5A is merely a perspective view showing one fin structure and one gate layer (gate structure) crossing the fin structure. The semiconductor structure may include additional fin structures and additional gate structures depending on design requirements. For example, FIG. 5B to FIG. 5K show two gate structures. It should also be noted that FIG. 5B to FIG. 5K are cross-sectional views illustrating the semiconductor structure at different fabrication stages taken along the line I-I' crossing the fin structure of FIG. 5A.

Figure 5B:
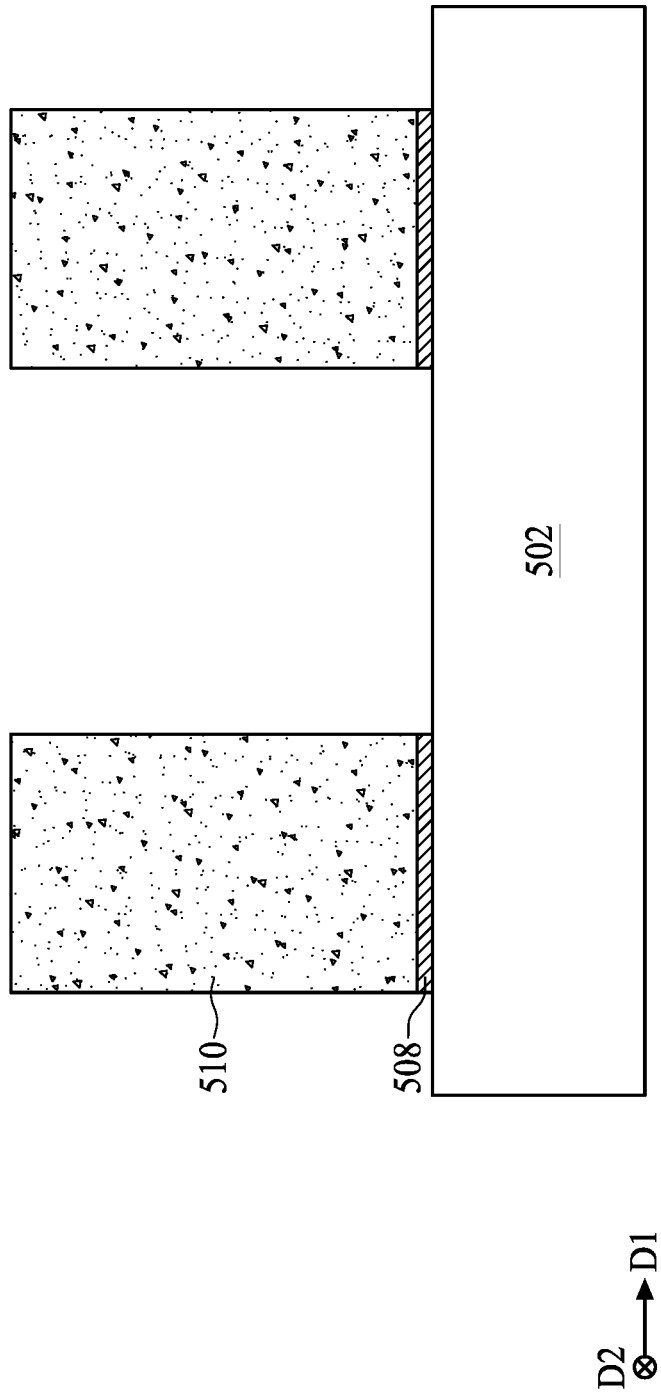

As shown in FIG. 5A and FIG. 5B, a substrate 502 is received. The substrate 502 may be a semiconductor wafer such as a silicon wafer. Alternatively or additionally, the substrate 502 may include elementary semiconductor materials, compound semiconductor materials, or alloy semiconductor materials. Examples of elementary semiconductor materials may be, for example but not limited thereto, single crystal silicon, polysilicon, amorphous silicon, germanium (Ge), and/or diamond. Examples of compound semiconductor materials may be, for example but not limited thereto, silicon carbide (SiC), gallium arsenic (GaAs), gallium phosphide (GaP), indium phosphide (InP), indium arsenide (InAs), and/or indium antimonide (InSb). Examples of alloy semiconductor material may be, for example but not limited thereto, SiGe, GaAsP, AlInAs, AlGaAs, GaInAs, GaInP, and/or GaInAsP.

The substrate 502 may include various doping configurations depending on design requirements as known in the art. For example, different doping wells (e.g., n wells, p wells) may be formed on the substrate 502 in regions designed for different device types (e.g., n-type field effect transistors (NFET) and p-type field effect transistors (PFET)). The suitable doping methods may include ion implantation of dopants and/or diffusion processes. Isolation structures (e.g., shallow trench isolation (STI) structures) 504 may be formed on the substrate 502. In some embodiments, the substrate 502 may include fin structures 506 isolated from each other by the isolation structures 504. In some embodiments, the fin structure 506 extends along a first direction D1. In some embodiments, the fin structure 506 may be replaced by a stacked nanosheet structure.

In some embodiments, a dielectric layer 508 is formed to cover the isolation structure 504 and the fin structure 506. In some embodiments, the dielectric layer 508 may include a dielectric material such as silicon oxide, but the disclosure is not limited thereto. A thickness of the dielectric layer 508 can be between approximately 20 angstroms and approximately 50 angstroms, but the disclosure is not limited thereto.

A gate layer 509 is formed over the substrate 502. In some embodiments, the gate layer 509 is made of polysilicon, but the disclosure is not limited thereto. The gate layer 509 and the dielectric layer 508 are patterned to form a sacrificial gate 510. The sacrificial gate 510 extends along a second direction D2 different from the first direction D1. The first direction D1 may be perpendicular to the second direction D2. The sacrificial gate 510 covers a portion of the fin structure 506 as shown in FIGS. 5A and 5B. The sacrificial gate 510 is at least partially disposed over the fin structure 506, and the portion of the fin structure 506 underlying the sacrificial gate 510 may be referred to as the channel region of a FET. The sacrificial gate 510 may also define source/drain regions of the fin structure 506, for example, portions of the fin structure 506 adjacent to and on opposing sides of the channel region. In some embodiments, the sacrificial gate 510 may be protected by a patterned hard mask (not shown).

Figure 5C:
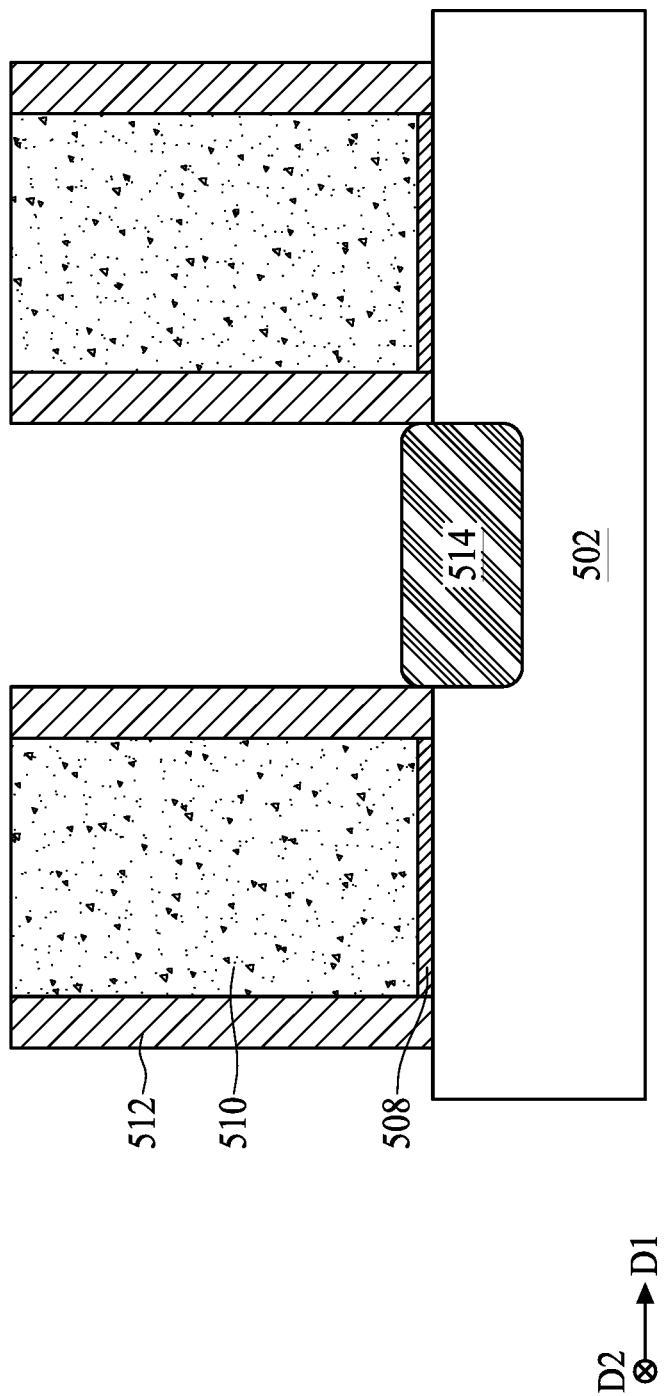

Referring to FIG. 5C, spacers 512 are formed over sidewalls of the sacrificial gate 510. In some embodiments, the material of the spacers 512 may include, but is not limited to, silicon nitride, silicon carbide, silicon oxide, silicon oxynitride or any suitable material. In some embodiments, the spacers 512 are formed by deposition and etching back operations. Subsequently, the fin structure 506 at two sides of the sacrificial gate 510 may be recessed. In some embodiments, a strained source/drain (S/D) structure 514 is formed at two sides of the sacrificial gate 510. In some embodiments, the strained S/D structures 514 are formed by growing a strained material by an epitaxial (epi) operation. In some embodiments, a lattice constant of the strained material may be different from a lattice constant of the substrate 502 and the fin structure 506. In some embodiments, the strained S/D structures 514 may include Ge, SiGe, InAs, InGaAs, InSb, GaSb, InAlP, InP, or a combination thereof, but the disclosure is not limited thereto. In some embodiments, the strained S/D structures 514 may form part of an electrical connection to a nanosheet stack, e.g., to electrically connect to a channel region of a nanosheet FET.

Figure 5D:
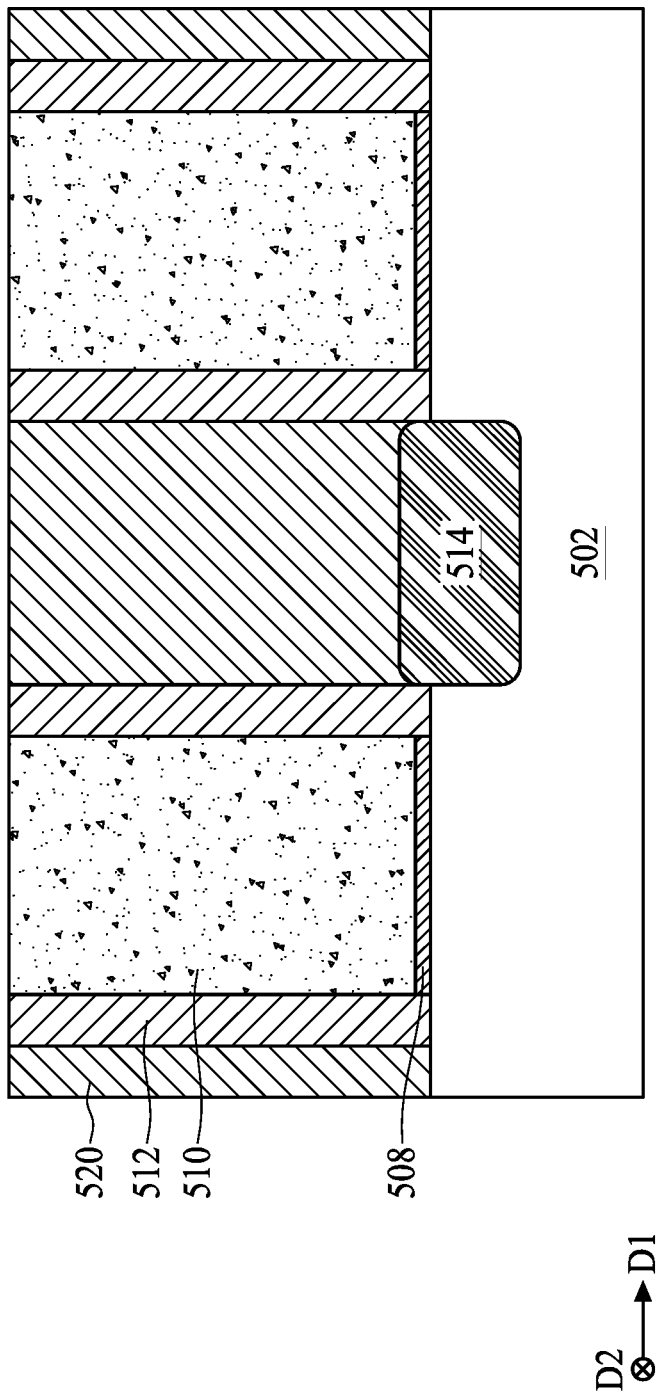

Referring to FIG. 5D, a dielectric structure 520 is formed over the substrate 502. In some embodiments, the dielectric structure 520 can include an etch-stop layer (e.g., a contact etch stop layer (CESL)) (not shown) and various dielectric layers (e.g., an inter-layer dielectric (ILD) layer) formed over the substrate 502 after the forming of the strained S/D structures 514. In some embodiments, the CESL includes a SiN layer, a SiCN layer, a SiON layer, and/or other materials known in the art. In some embodiments, the ILD layer includes materials such as tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. In some embodiments, after the CESL and the ILD layer are deposited, a planarization process, such as a chemical mechanical planarization (CMP) operation, may be performed to form the dielectric structure 520. Consequently, the dielectric structure 520 surrounds the sacrificial gate 510 and the fin structure 506. In other words, the strained S/D structures 514 (the fin structure 506) and the sacrificial gate 510 are embedded in the dielectric structure 520, while a top surface of the sacrificial gate 510 remains exposed. In some embodiments, the sacrificial gate 510 can be replaced with a metal gate structure, but the disclosure is not limited thereto.

Figure 5E:
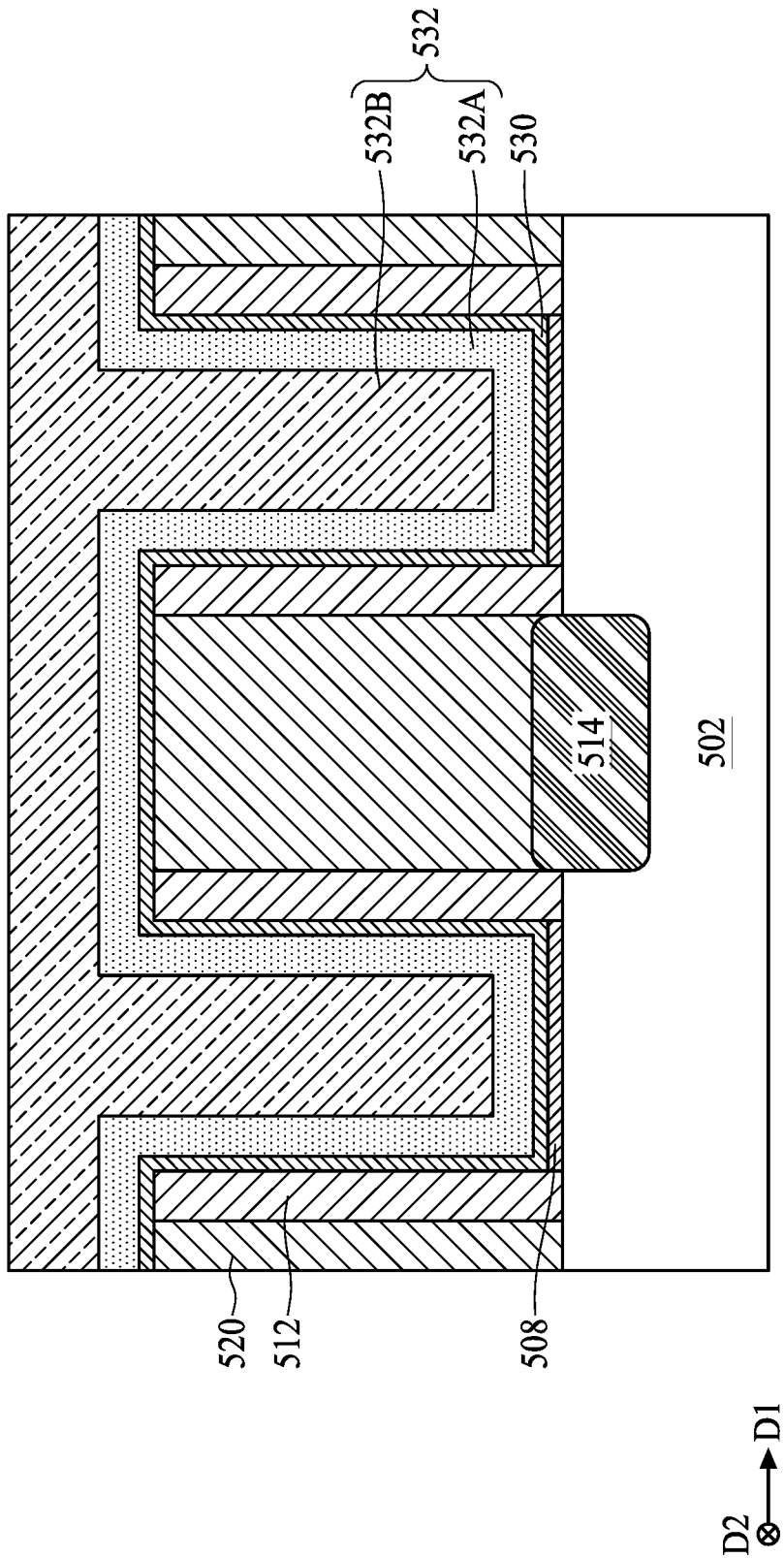

Referring to FIG. 5E, the sacrificial gate 510 is removed. In some embodiments, a dry etching operation is performed to remove the sacrificial gate 510. As shown in FIG. 5E, a gate dielectric layer 530 and a metal gate electrode 532 are formed over the dielectric layer 508. In some embodiments, the gate dielectric layer 530 includes a high-k dielectric material having a high dielectric constant, for example, greater than that of thermal silicon oxide (with a dielectric constant of about 3.9). The high-k dielectric material may include hafnium oxide (HfO2), zirconium oxide (ZrO2), lanthanum oxide (La2O3), aluminum oxide (Al2O3), titanium oxide (TiO2), yttrium oxide (Y2O3), strontium titanate (SrTiO3), hafnium oxynitride (HfOxNy), other suitable metal-oxides, or combinations thereof. In some embodiments, the metal gate electrode 532 may include at least a barrier metal layer (not shown), a work functional metal layer 532A and a gap-filling metal layer 532B. The barrier metal layer can include, for example but not limited to, TiN. The work function metal layer 532A can include a single layer of TiN, TaN, TaAlC, TiC, TaC, Co, Al, TiAl, HfTi, TiSi, TaSi or TiAlC, or a multilayer of two or more of these materials, but is not limited to this. For the n-channel FET, one or more of TaN, TaAlC, TiN, TiC, Co, TiAl, HfTi, TiSi and TaSi is used as the work function metal layer 532A, and for the p-channel FET, one or more of TiAlC, Al, TiAl, TaN, TaAlC, TiN, TiC and Co is used as the work function metal layer 532A. In some embodiments, the gap-filling metal layer 532B can include conductive material such as Al, Cu, AlCu, or W, but is not limited to the above-mentioned materials.

Figure 5F:
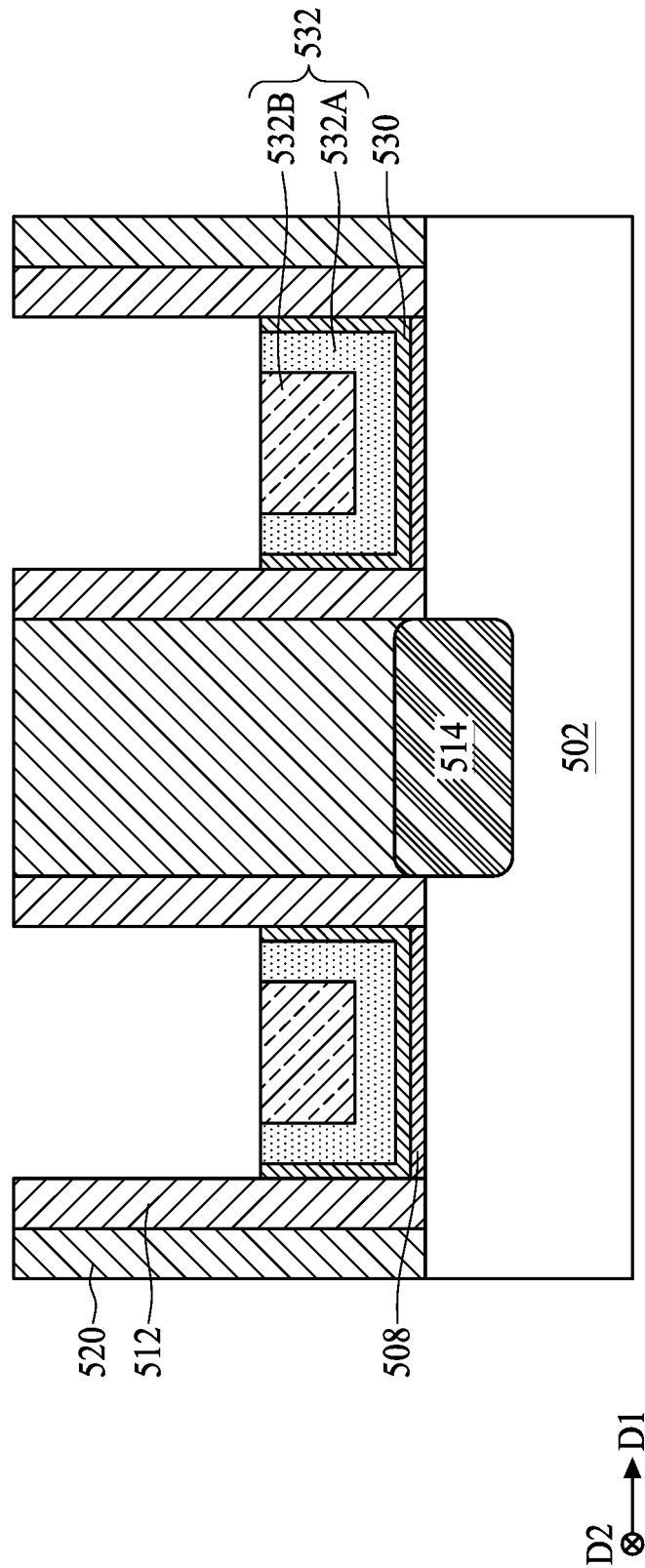

Referring to FIG. 5F, the gate dielectric layer 530 and the metal gate electrode 532 on the dielectric structure 520 can be removed by CMP, for example. Subsequently, the metal gate electrode 532 and the gate dielectric layer 530 can be recessed by etching for example, while a portion of the metal gate electrode 532 and the gate dielectric layer 530 remains between the spacers 512.

Figure 5G:
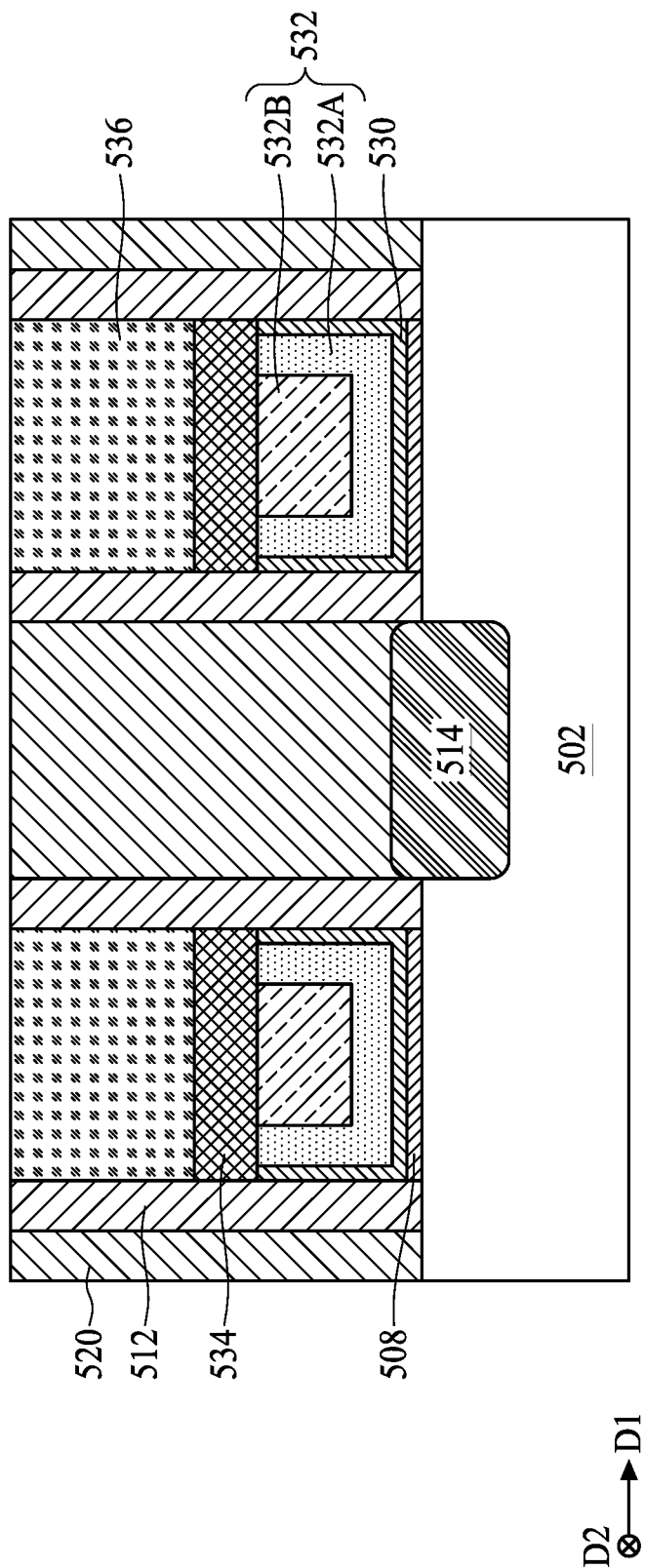

Referring to FIG. 5G, a cap layer 534 may be formed on the remaining metal gate electrode 532 and the gate dielectric layer 530 between the spacers 512. The cap layer 534 may include a dielectric material such as silicon oxide, silicon nitride or the like. A dielectric layer 536 can be formed on the cap layer 534 between the spacers 512. The dielectric layer 536 may include dielectric material such as tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. The dielectric layer 536 can be deposited, and a planarization operation, such as a chemical mechanical planarization (CMP) operation may be performed to remove the dielectric layer 536 on the dielectric structure 520.

Figure 5H:
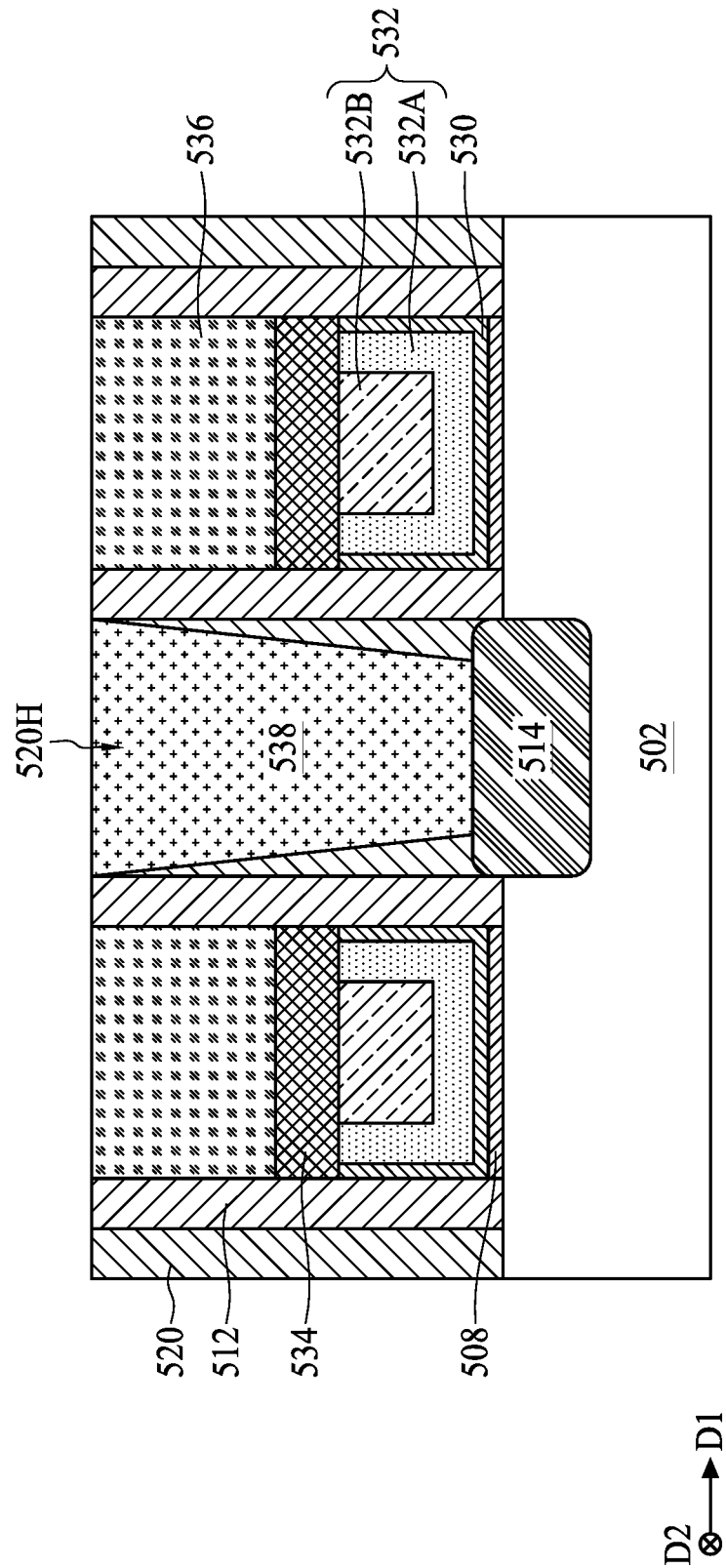

Referring to FIG. 5H, one or more holes 520H can be formed in the dielectric structure 520 to expose the strained S/D structures 514. The hole 520H can be formed by using a lithographic operation with masking technologies and anisotropic etch operation, but the disclosure is not limited thereto. Subsequently, a conductive layer, such as a cobalt layer, is formed in the hole 520H. In some embodiments, a liner, a barrier, a seed layer or any intervening layer can be formed between the conductive layer and the dielectric structure 520. In some other embodiments, the conductive layer and the dielectric structure 520 may include a barrier-less interface, i.e., the conductive layer can be formed in an absence of a liner, a barrier, a seed layer or any intervening layer. Therefore in such embodiments, the conductive layer can be in contact with the dielectric structure 520, but the disclosure is not limited thereto. Then, a planarization operation such as a chemical mechanical planarization (CMP) operation may be performed to remove the conductive layer on the dielectric structure 520 to form a conductive layer 538 electrically connected to the strained S/D structures 514.

Figure 5I:
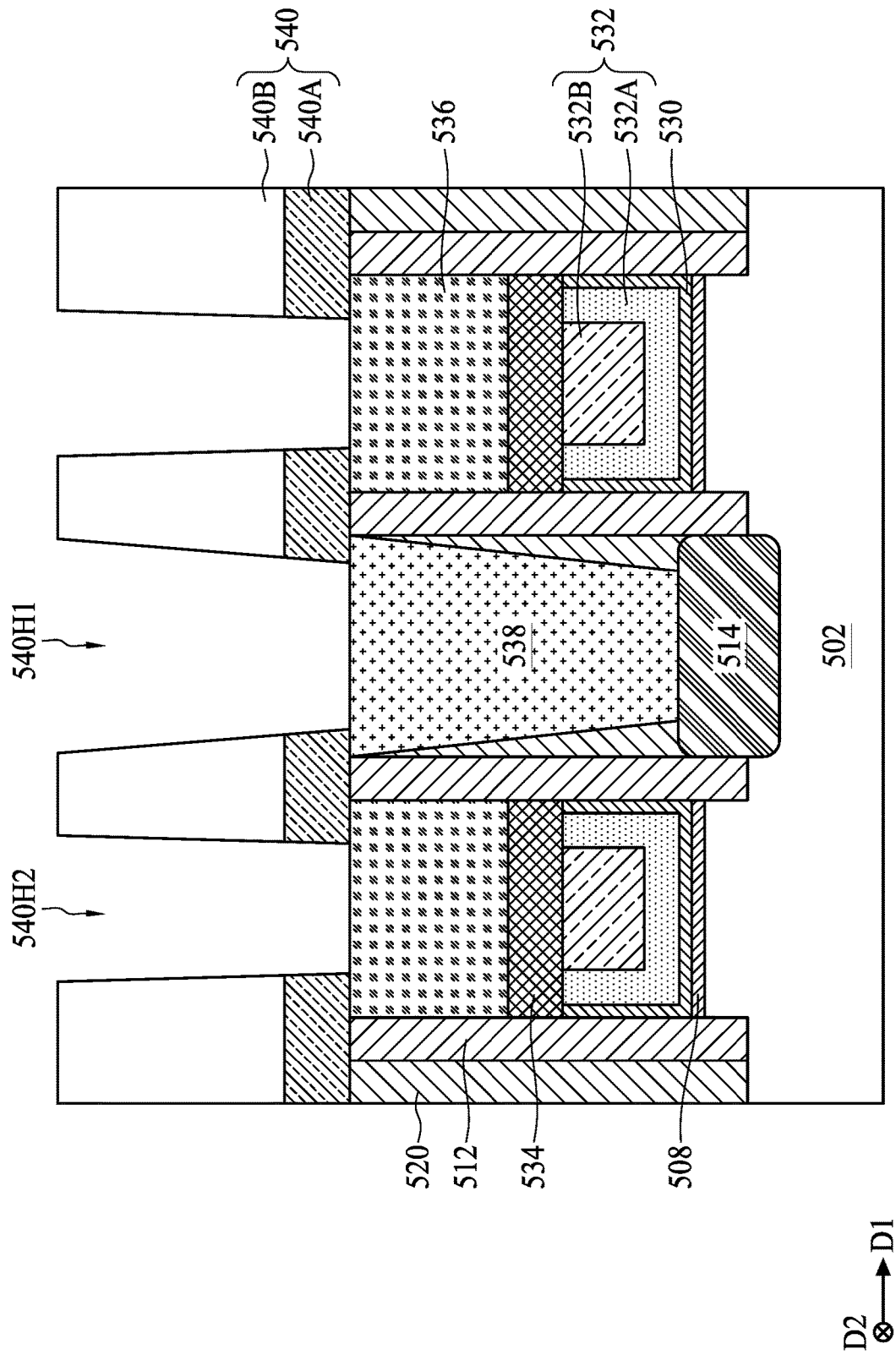

Referring to FIG. 5I, another dielectric layer 540 is formed on the dielectric structure 520. In some embodiments, the dielectric layer 540 may be a multi-layered dielectric layer including a first dielectric film 540A and a second dielectric film 540B. The first dielectric film 540A and the second dielectric film 540B each may include a dielectric material such as silicon nitride, silicon oxynitride, tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials or the like. The dielectric layer 540 is then patterned to form a plurality of holes 540H1. The holes 540H1 expose at least a portion of the conductive layer 538.

Figure 5J:
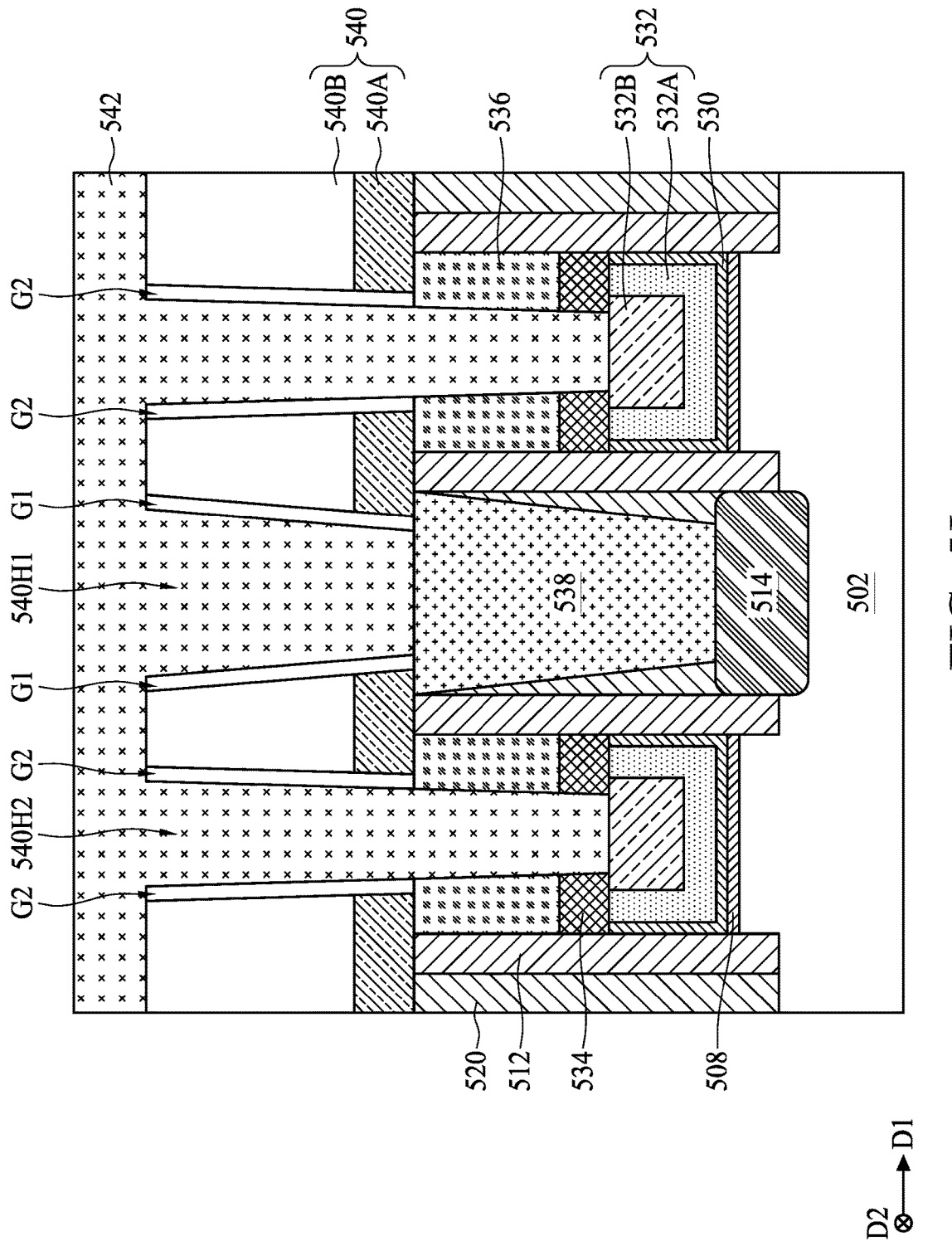

Referring to FIG. 5J, another conductive layer 542 is formed over the dielectric layer 540 and in the hole 540H1 of the dielectric layer 540. The material of the conductive layer 542 may be different from the conductive layer 538. By way of example, the material of the conductive layer 542 may include, but is not limited to, tungsten (W) or an alloy thereof, and the material of the conductive layer 538 may include, but is not limited to, cobalt (Co) or an alloy thereof. In some embodiments, the width or diameter of the hole 540H1 is, but not limited to, in a range from about 14 angstroms to about 20 angstroms. In some embodiments, the depth of the hole 540H1 is, but not limited to, in a range from about 10 angstroms to about 90 angstroms. In some other embodiments, the conductive layer 542 and the dielectric layer 540 may include a barrier-less interface, i.e., the conductive layer 542 can be formed in an absence of a liner, a barrier, a seed layer or any intervening layer. The interface between the dielectric layer 540 and the conductive layer 542 may be porous, and thus forms a gap G1 between the dielectric layer 540 and the conductive layer 542. For example, a tungsten-silicon oxide surface may be inherently porous, thereby forming a gap G1 and generating a liquid leakage path through the gap G1. In some embodiments, the width of the gap G1 is, but not limited to be, ranging from about 1 angstrom to about 10 angstroms.

Figure 5K:
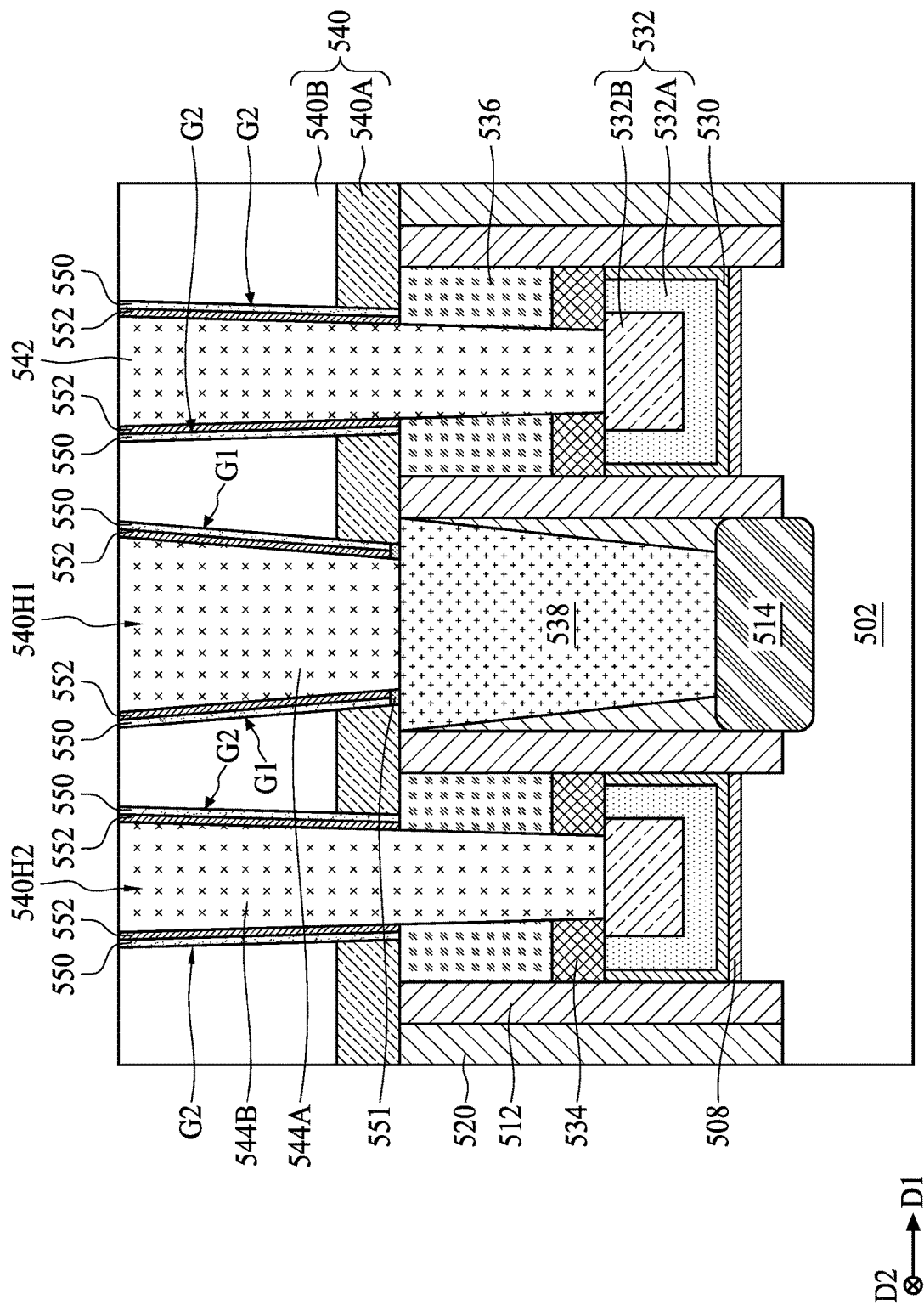

As shown in FIG. 5K, a CMP operation is performed to polish the conductive layer 542 to form a conductive plug 544A. The cross-sectional profile of the conductive plug 544A may include a rectangular profile, a trapezoid shape, an inversed trapezoid shape or other geometrical shape. In some embodiments, the conductive plug 544A has a protrusion (not shown) protruding into the conductive layer 538. In some embodiments, a depth of the protrusion of the conductive plug 554A is, but not limited to be, ranging from about 3 nanometers to about 10 nanometers.

When the conductive layer 542 over the dielectric layer 540 is removed during the CMP operation, the gap G1 is exposed. The slurry composition used to polish the conductive layer 542 may fill the gap G1. In some embodiments, the oxidizer or the liquid carrier of the slurry in the slurry composition can form an oxidized film of the conductive layer 538 on the exposed surface of the conductive layer 538 in the gap G1. The precipitant in the slurry composition can rapidly convert the oxidized film of the conductive layer 538 into a blocking layer 551 on the exposed surface of the conductive layer 538 in the gap G1, thereby blocking the liquid leakage path to the conductive layer 538 during the CMP operation. Moreover, since the precipitant renders the conductive layer 538 in the gap G1 to be covered with the blocking layer 551, the slurry will be blocked from reacting with the underlying conductive layer 538. Accordingly, the corrosion of the conductive layer 538 is avoided.

In some embodiments, the oxidizer or the liquid carrier of the slurry in the slurry composition can form an oxidized film of the conductive plug 544A on the exposed surface (i.e., the sidewall) of the conductive plug 544A in the gap G1. The precipitant in the slurry composition can rapidly convert the oxidized film of the conductive plug 544A into a blocking layer 552 on the exposed surface (i.e., the sidewall) of the conductive plug 544A in the gap G1, thereby blocking the liquid leakage path to the sidewall of the conductive plug 544A in the gap G1 during the CMP operation. Moreover, since the precipitant renders the sidewall of the conductive plug 544A in the gap G1 to be covered with the blocking layer 552, the slurry will not continuously react with the sidewall of the conductive plug 544A in the gap G1. Accordingly, the corrosion of the conductive layer 538 is avoided. Many aspects of the conductive layers 538 and 542, the conductive plug 544A, the gap G1, the blocking layers 551 and 552 are similar to those illustrated and discussed in FIGS. 4B to 4C, and are hereby omitted from discussion for simplicity and clarity.

In some embodiments, liquid components such as the liquid carrier may be vaporized successively, and other components of the slurry composition may remain in the gap G1, forming a protecting layer 550. In some embodiments, the protecting layer 550 is formed between the conductive plug 544A and the dielectric layer 540. In some embodiments, the blocking layer 552 is formed on the blocking layer 551. In some embodiments, the protecting layer 550 is formed over the blocking layer 551 and adjacent to the blocking layer 552. In some embodiments, the blocking layer 551 may precipitate in the protecting layer 550 in the gap G1. In some embodiments, the blocking layer 552 may precipitate in the protecting layer 550 in the gap G1. In some embodiments, the blocking layers 551 and 552 respectively have an arbitrary profile depending on different design requirements.

In some embodiments, the dielectric layer 540, the dielectric layer 536 and the cap layer 534 may be further patterned to form a plurality of holes 540H2 exposing the metal gate electrode 532, and the conductive layer 542 may be further formed in the holes 540H1 to form a conductive plug 544B electrically connecting to the metal gate electrode 532. In some embodiments, a gap G2 may further exist between the conductive plug 544B and the dielectric layer 540. In some embodiments, the protecting layer 550 is formed in the gap G2 between the conductive plug 544B and the dielectric layer 540. In some embodiments, the blocking layer 552 is formed in the gap G2 between the conductive plug 544B and the protecting layer 550. In some other embodiments, the gap G2 may further exist between the conductive plug 544B and the dielectric layer 536 and between the conductive plug 544B and the cap layer 534. In some embodiments, the protecting layer 550 and/or the blocking layer 552 may be formed in the gap G2 between the conductive plug 544B and the dielectric layer 536 and on an exposed surface of the dielectric layer 536. In some embodiments, the protecting layer 550 and/or the blocking layer 552 may be formed in the gap G2 between the conductive plug 544B and the cap layer 534 and on an exposed surface of the cap layer 534. In some embodiments, a pitch between the conductive plug 544A and the conductive plug 544B or a pitch between two conductive plugs 544B is greater than, but not limited to be, 40 nanometers.

In the present disclosure, a slurry composition including a precipitant is provided. The precipitant can convert an oxidized film of the conductive layer in the gap into a blocking layer on the exposed surface of a conductive layer and render the liquid leakage path to be blocked during the CMP operation. Accordingly, corrosion of underlying layer due to exposure to the slurry composition can be mitigated.

In some embodiments, a method for manufacturing a semiconductor structure includes following operations. A semiconductor structure is received. The semiconductor structure includes a first conductive layer, and a dielectric layer disposed over the first conductive layer. The dielectric layer includes a hole at least partially exposing the first conductive layer. A second conductive layer is deposited over the dielectric layer and in the hole of the dielectric layer, wherein a gap exists between a sidewall of the second conductive layer and the dielectric layer. A slurry composition is dispensed to the semiconductor structure. The slurry composition includes a slurry and a precipitant, wherein the slurry includes a liquid carrier and an oxidizer. The precipitant is caused to flow into the gap. The second conductive layer is polished with the slurry composition to form a conductive plug.

In some embodiments, a semiconductor structure includes a first conductive layer, a dielectric layer, a second conductive layer and a first blocking layer. The first conductive layer is disposed over a substrate. The dielectric layer is disposed over the conductive layer. The second conductive layer is disposed within the dielectric layer, and electrically connected to the first conductive layer. The second conductive layer includes a sidewall distant from the dielectric layer by a width. The first blocking layer is disposed on a surface of the first conductive layer between the second conductive layer and the dielectric layer. The first blocking layer includes at least one element of a precipitant.

In some embodiments, a slurry composition for polishing includes a slurry and at least one precipitant dispensed in the slurry. The slurry includes at least one liquid carrier, at least one abrasives, at least one oxidizer and at least one corrosion inhibitor.

The foregoing outlines structures of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   receiving a semiconductor structure including a first conductive layer and a dielectric layer disposed over the first conductive layer, wherein the dielectric layer includes a hole at least partially exposing the first conductive layer;
   depositing a second conductive layer over the dielectric layer and in the hole of the dielectric layer, wherein a gap exists between a sidewall of the second conductive layer and the dielectric layer;
   dispensing a slurry composition to the semiconductor structure, wherein the slurry composition comprises a slurry and a precipitant, and the slurry includes a liquid carrier and an oxidizer;
   causing the precipitant to flow into the gap; and
   polishing the second conductive layer with the slurry composition to form a conductive plug.

2. The method of claim 1, further comprising:
   oxidizing the first conductive layer to form a first oxidized film; and
   converting the first oxidized film into a first precipitate with the precipitant.

3. The method of claim 2, wherein the first precipitate is formed on an exposed surface of the first conductive layer in the gap.

4. The method of claim 2, wherein the first precipitate blocks the first conductive layer from the slurry.

5. The method of claim 1, further comprising:
   oxidizing the second conductive layer to form a second oxidized film; and
   converting the second oxidized film into a second precipitate with the precipitant.

6. The method of claim 5, wherein the second precipitate is formed on the sidewall of the second conductive layer in the gap.

7. The method of claim 5, wherein the second precipitate blocks the second conductive layer from the slurry.

8. The method of claim 1, wherein the slurry composition further comprises at least one corrosion inhibitor, and an ionic radius of a cation or an anion of the corrosion inhibitor is greater than an ionic radius of a cation or an anion of the precipitant.

9. The method of claim 1, wherein the precipitant includes at least one of a cation and an anion, and an ionic radius of the cation or the anion is less than a half-width of the gap.

10. The method of claim 9, wherein the cation of the precipitant comprises alkaline-earth cation.

11. The method of claim 9, wherein the anion of the precipitant comprises phosphide, nitrite, phosphate, or a mixture thereof.

12. A method, comprising:
- receiving a semiconductor structure including a first conductive layer and a dielectric layer disposed over the first conductive layer, wherein the dielectric layer includes a hole exposing the first conductive layer;
- depositing a second conductive layer over the dielectric layer and in the hole of the dielectric layer, wherein a gap exists between a sidewall of the second conductive layer and the dielectric layer;
- dispensing a slurry composition to the semiconductor structure, wherein the slurry composition comprises a slurry and a precipitant, and the slurry including an oxidizer; and
- causing the precipitant and the oxidizer to flow through the gap and reach an upper surface of the first conductive layer to obtain a first precipitate formed on the upper surface of the first conductive layer in the gap.

13. The method of claim 12, further comprising causing the precipitant and the oxidizer to reach a sidewall of the second conductive layer to obtain a blocking layer formed on the sidewall, wherein the blocking layer is insoluble in a liquid carrier of the slurry.

14. The method of claim 12, further comprising causing the precipitant and the oxidizer to reach an upper surface of the second conductive layer to obtain a second precipitate on the upper surface of the second conductive layer.

15. The method of claim 12, further comprising polishing the upper surface of the second conductive layer to at least partially remove the second precipitate from the upper surface of the second conductive layer.

16. The method of claim 15, further comprising filling the gap with components of the slurry apart from a liquid carrier of the slurry subsequent to the polishing.

17. A method, comprising:
- depositing a first conductive layer over a substrate;
- forming a patterned dielectric layer over the first conductive layer, wherein the dielectric layer includes a hole exposing the first conductive layer;
- depositing a second conductive layer in the hole of the dielectric layer, wherein a gap between the second conductive layer and the dielectric layer exposes a portion of the first conductive layer;
- dispensing a slurry composition to the semiconductor structure to form an oxide of the first conductive layer at the portion of the first conductive layer, wherein the slurry composition comprises a slurry and a precipitant, and the slurry comprises a liquid carrier; and
- causing the precipitant to react with the oxide of the first conductive layer to obtain a blocking layer insoluble in a liquid carrier of the slurry.

18. The method of claim 17, wherein the precipitant includes a cation and an anion, and an ionic radius of the cation or the anion is less than about 5 angstroms.

19. The method of claim 17, wherein the second conductive layer comprises tungsten, and the slurry composition has a pH value of greater than about 7.0.

20. The method of claim 17, wherein the slurry further comprises an oxidizer, further comprising oxidizing the first conductive layer and the second conductive layer to form the oxide of the first conductive layer and an oxide of the second conductive layer.

* * * * *